US012402306B2

(12) United States Patent
Kim et al.

(10) Patent No.: US 12,402,306 B2
(45) Date of Patent: Aug. 26, 2025

(54) SEMICONDUCTOR DEVICE HAVING PERIPHERAL CIRCUIT AREAS AT BOTH SIDES OF SUBSTRATE AND DATA STORAGE SYSTEM INCLUDING THE SAME

(71) Applicant: SAMSUNG ELECTRONICS CO., LTD., Suwon-si (KR)

(72) Inventors: Jiwon Kim, Seoul (KR); Jaeho Ahn, Seoul (KR); Sungmin Hwang, Hwaseong-si (KR); Joonsung Lim, Seongnam-si (KR); Sukkang Sung, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 843 days.

(21) Appl. No.: 17/239,829

(22) Filed: Apr. 26, 2021

(65) Prior Publication Data

US 2022/0130846 A1    Apr. 28, 2022

(30) Foreign Application Priority Data

Oct. 28, 2020  (KR) .................. 10-2020-0141233

(51) Int. Cl.
*G11C 16/24*   (2006.01)
*G11C 5/06*    (2006.01)
(Continued)

(52) U.S. Cl.
CPC .............. *H10B 41/27* (2023.02); *G11C 5/06* (2013.01); *H01L 23/5226* (2013.01); *H10B 43/27* (2023.02); *H10D 30/63* (2025.01)

(58) Field of Classification Search
CPC ......... H01L 25/18; H01L 24/08; H01L 24/80; H01L 25/50; H01L 23/481;
(Continued)

(56) References Cited

U.S. PATENT DOCUMENTS 5,355,022 A * 10/1994 Sugahara ............ H01L 21/2007
257/757
9,406,711 B2    8/2016 Chen et al.
(Continued)

FOREIGN PATENT DOCUMENTS

KR    10-2022-0005200 A    1/2022

OTHER PUBLICATIONS

Office Action in Korean Appln. No. 10-2020-0141233, mailed on Apr. 8, 2025, 15 pages (with English translation).

*Primary Examiner* — Ajay Ojha
*Assistant Examiner* — Tsz K Chiu
(74) *Attorney, Agent, or Firm* — Fish & Richardson P.C.

(57) ABSTRACT

A semiconductor device including a cell area including a first substrate, gate electrodes on the first substrate, a channel structure extending through the gate electrodes, cell contact plugs, a through contact plug, and first bonding pads, the first peripheral circuit area including second bonding pads on the first bonding pads; a second peripheral circuit area connected to the first peripheral circuit area; and a second substrate between the first peripheral circuit area and the second peripheral circuit area, the second substrate including a first surface in the first peripheral circuit area and a second surface in the second peripheral circuit area, wherein the second peripheral circuit area includes a device on the second surface, and a through electrode extending vertically through the second substrate and connected to the first peripheral circuit area.

20 Claims, 29 Drawing Sheets

(51) Int. Cl.

| | | |
|---|---|---|
| *G11C 16/08* | (2006.01) | |
| *H01L 23/522* | (2006.01) | |
| *H01L 27/11539* | (2017.01) | |
| *H01L 27/11556* | (2017.01) | |
| *H01L 27/11573* | (2017.01) | |
| *H01L 27/11582* | (2017.01) | |
| *H10B 41/27* | (2023.01) | |
| *H10B 43/27* | (2023.01) | |
| *H10D 30/63* | (2025.01) | |

(58) Field of Classification Search
CPC . H01L 23/5226; H01L 24/05; H01L 29/7827; H01L 27/0694; H01L 27/0688; H10B 43/10; H10B 43/35; H10B 41/10; H10B 41/41; H10B 43/40
See application file for complete search history.

(56) References Cited

U.S. PATENT DOCUMENTS

| | | | | |
|---|---|---|---|---|
| 9,558,945 | B2* | 1/2017 | Fukuzumi | H01L 25/50 |
| 10,199,326 | B1* | 2/2019 | Ohsaki | H10B 43/20 |
| 10,354,980 | B1* | 7/2019 | Mushiga | H01L 21/76898 |
| 10,354,987 | B1 | 7/2019 | Mushiga et al. | |
| 10,355,009 | B1* | 7/2019 | Kai | H01L 21/76877 |
| 10,600,763 | B1* | 3/2020 | Xiao | H01L 21/8221 |
| 10,636,813 | B1* | 4/2020 | Xiao | H01L 21/02598 |
| 10,665,581 | B1* | 5/2020 | Zhou | H01L 27/0688 |
| 10,910,272 | B1* | 2/2021 | Zhou | H10B 43/40 |
| 10,998,301 | B2* | 5/2021 | Kanamori | H10B 43/27 |
| 11,315,639 | B2* | 4/2022 | Oh | H10B 43/27 |
| 11,322,483 | B1* | 5/2022 | Ogawa | H01L 25/50 |
| 11,450,653 | B2* | 9/2022 | Huang | H01L 24/33 |
| 11,545,456 | B2* | 1/2023 | Goda | H10B 41/10 |
| 11,587,871 | B2* | 2/2023 | Suzuki | H10B 43/50 |
| 11,594,547 | B2* | 2/2023 | Fukuzumi | H10B 43/30 |
| 2004/0141369 | A1* | 7/2004 | Noguchi | G11C 7/1078 365/158 |
| 2010/0155932 | A1* | 6/2010 | Gambino | H01L 27/0688 257/713 |
| 2014/0061750 | A1* | 3/2014 | Kwon | H10B 41/40 257/314 |
| 2016/0079164 | A1* | 3/2016 | Fukuzumi | H01L 21/185 438/107 |
| 2016/0379936 | A1 | 12/2016 | Spitzsperger et al. | |
| 2019/0081069 | A1 | 3/2019 | Lu et al. | |
| 2019/0221557 | A1 | 7/2019 | Kim et al. | |
| 2019/0229125 | A1* | 7/2019 | Zhou | H10B 41/27 |
| 2019/0252404 | A1* | 8/2019 | Kaminaga | H10B 43/27 |
| 2019/0296041 | A1 | 9/2019 | Yamasaka et al. | |
| 2020/0006299 | A1* | 1/2020 | Liu | H10B 41/50 |
| 2020/0006370 | A1* | 1/2020 | Huo | H10B 41/40 |
| 2020/0066703 | A1* | 2/2020 | Kim | H10B 43/35 |
| 2020/0105721 | A1* | 4/2020 | Park | H01L 24/89 |
| 2020/0144242 | A1* | 5/2020 | Park | H10B 41/50 |
| 2020/0194452 | A1* | 6/2020 | Xiao | H01L 23/5226 |
| 2020/0328176 | A1* | 10/2020 | Liu | H10B 41/41 |
| 2020/0411509 | A1* | 12/2020 | Yang | H01L 27/14636 |
| 2021/0111137 | A1* | 4/2021 | Chen | H01L 24/89 |
| 2022/0005820 | A1 | 1/2022 | Kim et al. | |
| 2022/0122932 | A1* | 4/2022 | Oh | G11C 5/025 |
| 2023/0005541 | A1* | 1/2023 | Yang | H10B 41/27 |
| 2023/0005544 | A1* | 1/2023 | Chen | G11C 16/0483 |
| 2023/0005865 | A1* | 1/2023 | Liu | H01L 24/08 |
| 2023/0068995 | A1* | 3/2023 | Yang | H01L 24/80 |

* cited by examiner

FIG. 5
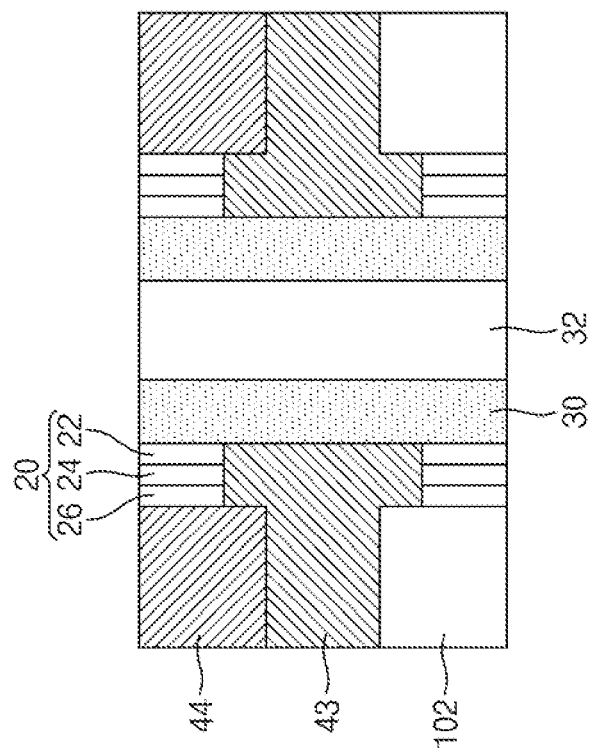
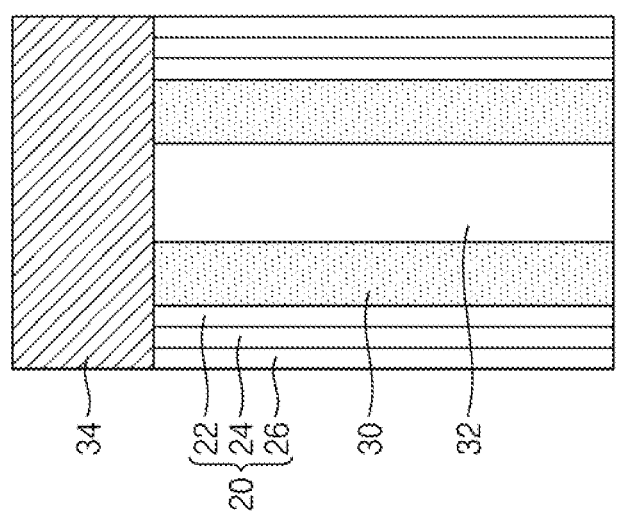

SEMICONDUCTOR DEVICE HAVING PERIPHERAL CIRCUIT AREAS AT BOTH SIDES OF SUBSTRATE AND DATA STORAGE SYSTEM INCLUDING THE SAME

CROSS-REFERENCE TO THE RELATED APPLICATION

Korean Patent Application No. 10-2020-0141233, filed on Oct. 28, 2020, in the Korean Intellectual Property Office, and entitled: "Semiconductor Device Having Peripheral Circuit Areas at Both Sides of Substrate and Data Storage System Including the Same," is incorporated by reference herein in its entirety.

BACKGROUND

1. Field

Embodiments relate to a semiconductor device having peripheral circuit areas at both sides of a substrate and a data storage system including the same.

2. Description of the Related Art

A 3-dimensional nonvolatile memory device having a multi-stack structure has been considered for lightness, thinness, simplification, miniaturization, and high integration of electronic products. Such a nonvolatile memory device may include a cell area, and a peripheral circuit area connected to the cell area.

SUMMARY

The embodiments may be realized by providing a semiconductor device including a cell area including a first substrate, gate electrodes on the first substrate and spaced apart from one another in a vertical direction, a channel structure extending vertically through the gate electrodes, cell contact plugs connected to the gate electrodes and extending in the vertical direction, a through contact plug connected to the first substrate and extending in the vertical direction, and first bonding pads electrically connected to the channel structure, the cell contact plugs and the through contact plug; a first peripheral circuit area connected to the cell area on the cell area, the first peripheral circuit area including second bonding pads on the first bonding pads; a second peripheral circuit area connected to the first peripheral circuit area; and a second substrate between the first peripheral circuit area and the second peripheral circuit area, the second substrate including a first surface in the first peripheral circuit area and a second surface in the second peripheral circuit area, wherein the second peripheral circuit area includes a device on the second surface, and a through electrode extending vertically through the second substrate and connected to the first peripheral circuit area.

The embodiments may be realized by providing a semiconductor device including a cell area including a first substrate, gate electrodes on a first surface of the first substrate and spaced apart from one another in a vertical direction, a channel structure extending vertically through the gate electrodes, cell contact plugs connected to the gate electrodes and extending in the vertical direction, a through contact plug connected to the first substrate and extending in the vertical direction, and first bonding pads electrically connected to the channel structure, the cell contact plugs, and the through contact plug; a first peripheral circuit area under the cell area and connected to the cell area, the first peripheral circuit area including second bonding pads on the first bonding pads; and a second peripheral circuit area connected to the cell area on the cell area, wherein the first substrate is between the cell area and the second peripheral circuit area, the first substrate including the first surface in the cell area and a second surface in the second peripheral circuit area, and wherein the second peripheral circuit area includes a device on the second surface, and a through electrode extending vertically through the first substrate such that the through electrode is electrically connected to the cell area.

The embodiments may be realized by providing a semiconductor device including a cell area including a first substrate, gate electrodes on the first substrate and spaced apart from one another in a vertical direction, a channel structure extending vertically through the gate electrodes, cell contact plugs connected to the gate electrodes and extending in the vertical direction, a through contact plug connected to the first substrate and extending in the vertical direction, and first bonding pads electrically connected to the channel structure, the cell contact plugs, and the through contact plug; a first peripheral circuit area on the cell area and connected to the cell area, the first peripheral circuit area including second bonding pads on the first bonding pads, respectively; a second peripheral circuit area on the first peripheral circuit area and connected to the first peripheral circuit area; a semiconductor storage device including a second substrate between the first peripheral circuit area and the second peripheral circuit area and including a first surface in the first peripheral circuit area and a second surface in the second peripheral circuit area, and an input/output pad electrically connected to at least one of the first peripheral circuit area or the second peripheral circuit area; and a controller electrically connected to the semiconductor storage device through the input/output pad such that the controller controls the semiconductor storage device, wherein the second peripheral circuit area includes a device on the second surface, and a through electrode extending vertically through the second substrate such that the through electrode is electrically connected to the first peripheral circuit area.

BRIEF DESCRIPTION OF THE DRAWINGS

Features will be apparent to those of skill in the art by describing in detail exemplary embodiments with reference to the attached drawings in which:

FIG. 5 is an enlarged view of the semiconductor device shown in FIG. 4.

DETAILED DESCRIPTION

Figure 1:
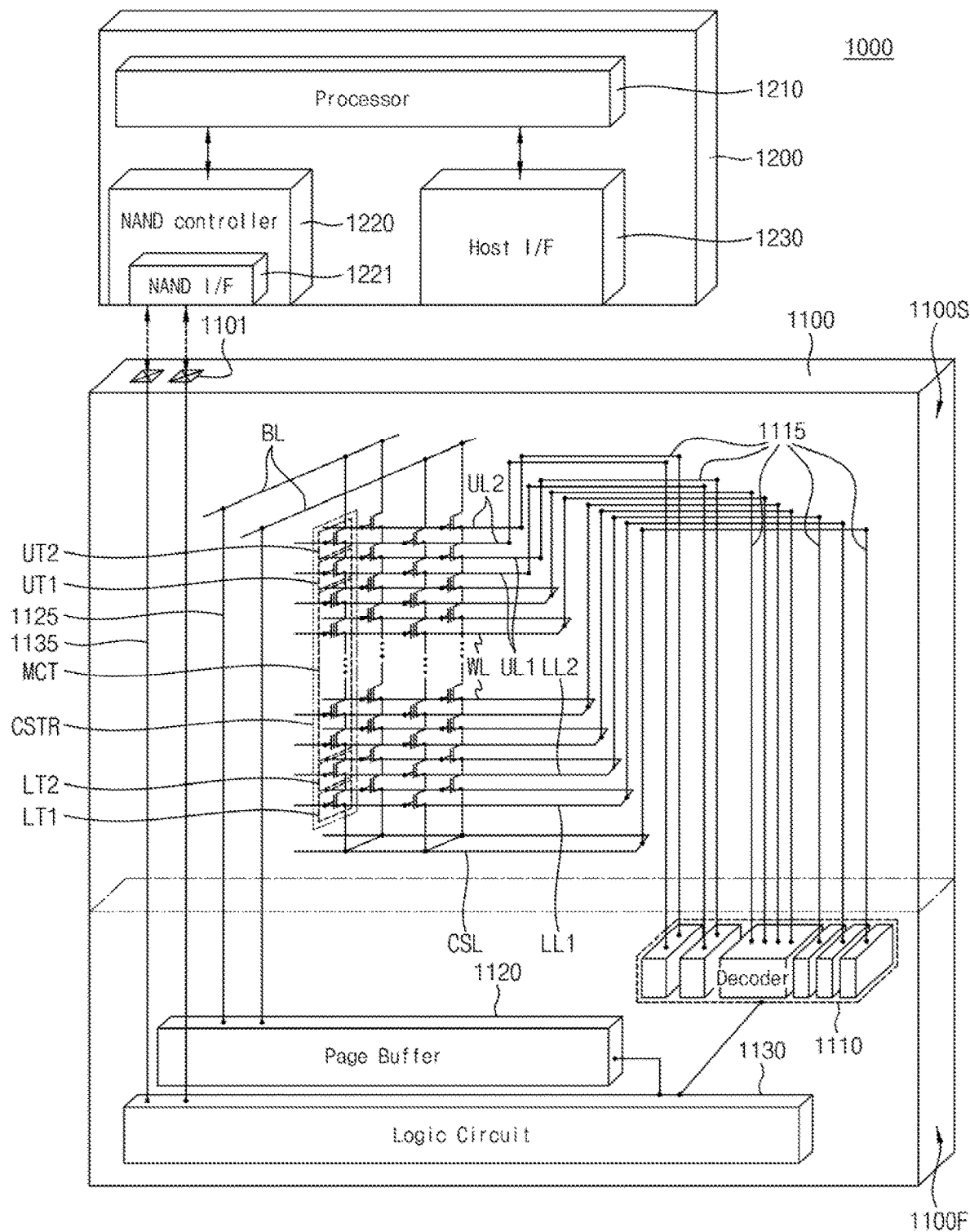
FIG. 1 is a diagram of a memory system according to an exemplary embodiment.

FIG. 1 is a diagram of a memory system according to an exemplary embodiment.

Referring to FIG. 1, a memory system 1000 may include a memory device 1100 and a controller 1200 connected to a pad 1101 of the memory device 1100. The memory device 1100 may include a cell area 1100S and a peripheral circuit area 1100F.

The cell area 1100S may include a plurality of cell strings CSTR each including memory cell transistors MCT connected to one another in series, and a first upper transistor UT1, a second upper transistor UT2, a first lower transistor LT1, and a second lower transistor LT2, which are connected to opposite ends of the memory cell transistors MCT. The plurality of cell strings CSTR may be connected to corresponding ones of bit lines BL in parallel, respectively. The plurality of cell strings CSTR may be connected to a common source line CSL in common. In an implementation, a plurality of cell strings CSTR may be between a plurality of bit lines BL and a single common source line CSL.

The memory cell transistors MCT, which are connected to one another in series, may be controlled by word lines WL for selecting cell strings CSTR. Each of the memory cell transistors MCT may include a data storage element. Gate electrodes of the memory cell transistors MCT spaced apart from the common source line CSL by the same distance may be connected to one of the word lines WL in common and, as such, may be in an equipotential state. In an implementation, even when the gate electrodes of the memory cell transistors MCT are spaced apart from the common source line CSL by the same distance, the gate electrodes, which are in different rows or columns, may be independently controlled.

The first lower transistor LT1 and the second lower transistor LT2 may be ground selection transistors, respectively. The first lower transistor LT1 and the second lower transistor LT2 may be controlled by a first lower line LL1 and a second lower line LL2, respectively, and may be connected to the common source line CSL. The first upper transistor UT1 and the second upper transistor UT2 may be string selection transistors, respectively. The first upper transistor UT1 and the second upper transistor UT2 may be controlled by a first upper line UL1 and a second upper line UL2, respectively, and may be connected to corresponding ones of the bit lines BL, respectively. In an embodiment, at least one dummy line or buffer line may be further disposed between an uppermost one of word lines WL and the first upper transistor UT1. At least one dummy line may also be disposed between a lowermost one of the word lines WL and the second lower transistor LT2. In the specification, the term "dummy" is used to represent a configuration which has a structure and a shape identical or similar to those of another constituent element, but is simply present as a pattern without performing a substantial function in a device.

When a signal is applied to the first upper transistor UT1 and the second upper transistor UT2, which are string selection transistors, via the first upper line UL1 and the second upper line UL2, a signal applied to the corresponding bit line BL is transferred to the memory cell transistors MCT connected to one another in series and, as such, a data read or data write operation may be executed. In addition, when a predetermined erase voltage is applied through a substrate, a data erase operation for erasing data written in the memory cell transistors MCT may be executed. In an implementation, the cell area 1100S may include at least one dummy cell string CSTR electrically isolated from the bit lines BL.

The peripheral circuit area 1100F may include a row decoder 1110, a page buffer 1120, and a logic circuit 1130. The row decoder 1110 may be connected to the word lines WL, the first upper transistor UT1, the second upper transistor UT2, the first lower transistor LT1, the second lower transistor LT2, and the common source line CSL. The page buffer 1120 may be connected to the bit lines BL via connection lines 1125. The logic circuit 1130 may be connected to the row decoder 1110 and the page buffer 1120, and may be connected to a controller 1200 via the pad 1101.

The row decoder 1110 decodes an input address, thereby generating and transferring drive signals for the word lines WL. The row decoder 1110 may provide a word line voltage generated from a voltage generation circuit in the logic circuit 1130 under control of the logic circuit 1130 to a selected one of the word lines WL and an unselected one of the word lines WL.

The page buffer 1120 may be connected to the cell area 1100S via a bit line BL and, as such, may read out information stored in a memory cell. The page buffer 1120 may temporarily store data to be stored in the memory cell or may sense data stored in the memory cell in accordance with an operation mode. The page buffer 1120 may include a column decoder and a sense amplifier. The column decoder may selectively activate the bit lines BL of the cell area 1100S. The sense amplifier may sense a voltage of the bit line BL selected by the column decoder in a read operation and, as such, may read out data stored in a selected memory cell.

The logic circuit 1130 may control operation of the row decoder 1110 and operation of the page buffer 1120. The logic circuit 1130 may include a voltage generation circuit configured to generate voltages required for internal operations, for example, a program voltage, a read voltage, an erase voltage, etc., using an external voltage. The logic circuit 1130 may control a read operation, a write operation and/or an erase operation in response to control signals. In addition, the logic circuit 1130 may include an input/output circuit. In a program operation, the input/output circuit may receive data DATA input thereto, and may transfer the received data DATA to the page buffer 1120. In a read operation, the input/output circuit may receive data DATA from the page buffer 1120, and may output the received data DATA to the outside thereof. The logic circuit 1130 may be connected to the controller 1200 via a connection line 1135 and the pad 1101.

The controller 1200 may include a processor 1210, a NAND controller 1220, and a host interface 1230. The processor 1210 performs control operations for data exchange of the NAND controller 1220. The NAND controller 1220 controls data exchange with the NAND controller 1220. The NAND controller 1220 may include a NAND interface 1221. The NAND interface 1221 interfaces with the memory device 1100 according to the exemplary embodiment of the disclosure. The host interface 1230 includes a data exchange protocol of a host connected to the memory system 1000.

Figure 2:
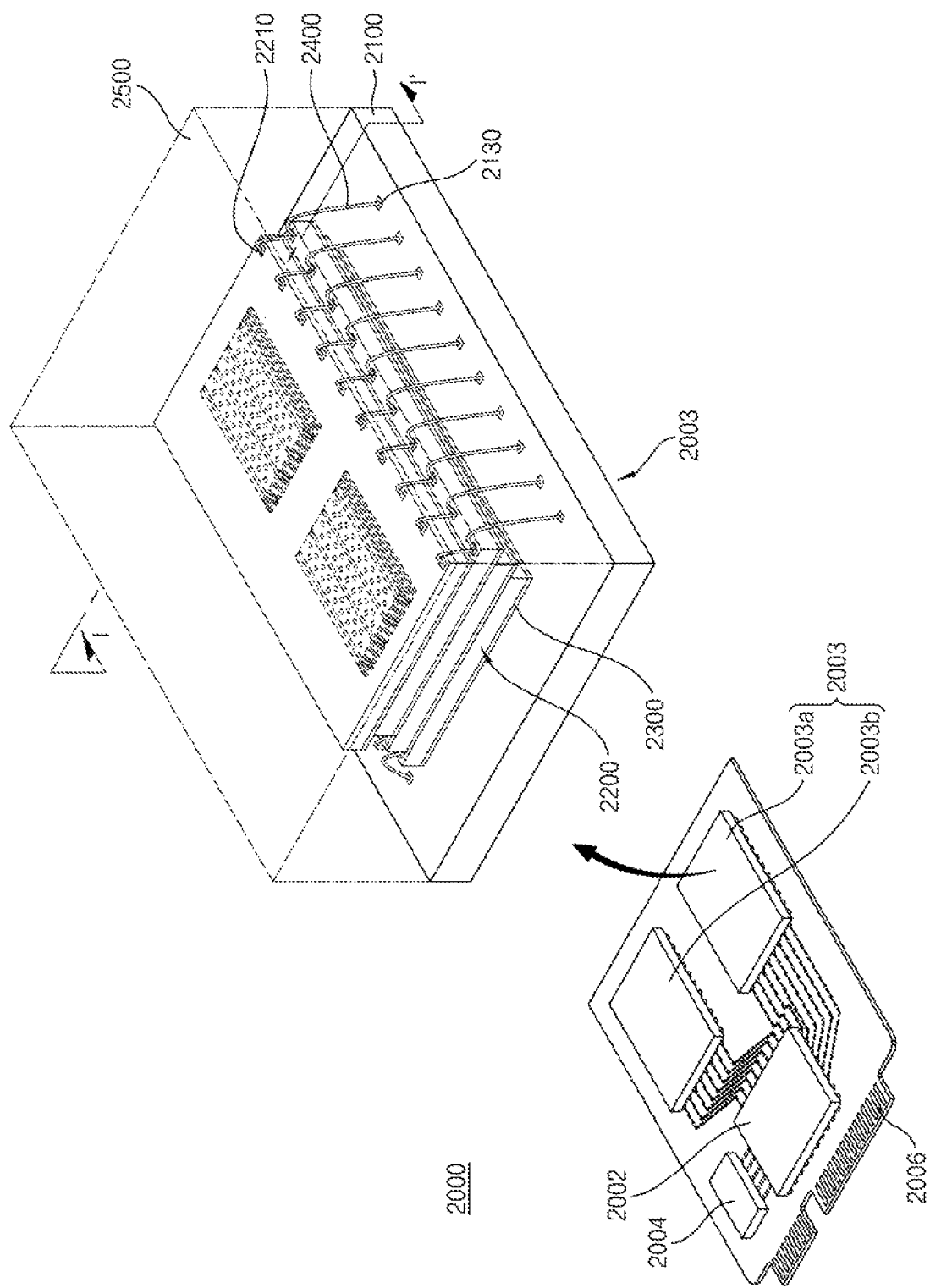
FIG. 2 is a memory card according to an exemplary embodiment.
Figure 3:
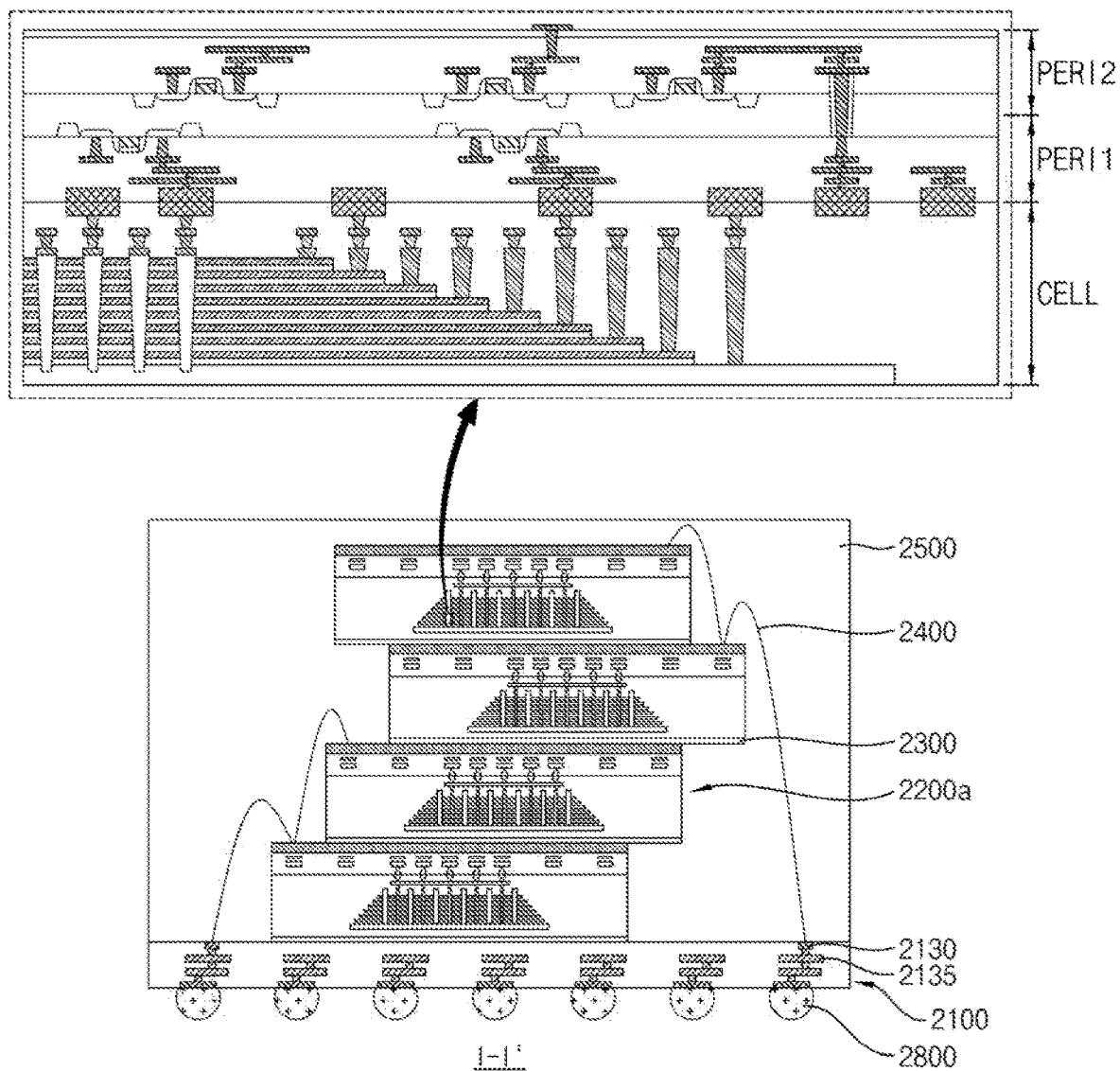
FIG. 3 is a cross-sectional view of the semiconductor package shown in FIG. 2 taken along line I-I'.

FIG. 2 is a memory card according to an exemplary embodiment. FIG. 3 is a cross-sectional view of the semiconductor package shown in FIG. 2 taken along line I-I'.

Referring to FIG. 2, the memory system 2000 may be a solid state drive (SSD), a memory card, or a universal serial bus (USB) device. The memory system 2000 may include semiconductor packages 2003 (2003a and 2003b), devices 2002 and 2004, and a connector 2006 which are on a main substrate. In an implementation, each of the semiconductor packages 2003 (2003a and 2003b) may include the memory device 1100 shown in FIG. 1. The devices 2002 and 2004 may correspond to the controller 1200. In an implementation, each semiconductor package 2003 may include a package substrate 2100, a memory stack 2200 on the package substrate 2100, an adhesive layer 2300 between the package substrate 2100 and the memory stack 2200, a wire 2400 electrically connecting the package substrate 2100 and the memory stack 2200, and an encapsulator 2500 covering the package substrate 2100 and the memory stack 2200.

Further referring to FIG. 3, the package substrate 2100 may include a substrate pad 2130 and a wiring layer 2135. The substrate pad 2130 may be at an upper surface of the package substrate 2100, and may be connected to a chip pad 2210 via the wire 2400. The wiring layer 2135 may be disposed in the package substrate 2100, and may be electrically connected to the substrate pad 2130.

A plurality of memory devices 2200a may be stacked on the package substrate 2100. Each memory device 2200a may correspond to a semiconductor device 100 which will be described later with reference to FIG. 4. The plurality of memory devices 2200a may be fixed to one another by adhesive layers 2300 respectively at lower surfaces of the memory devices 2200a, and may be connected to the package substrate 2100 by the wire 2400. An external connection terminal 2800 may be at a lower surface of the package substrate 2100.

Figure 4:
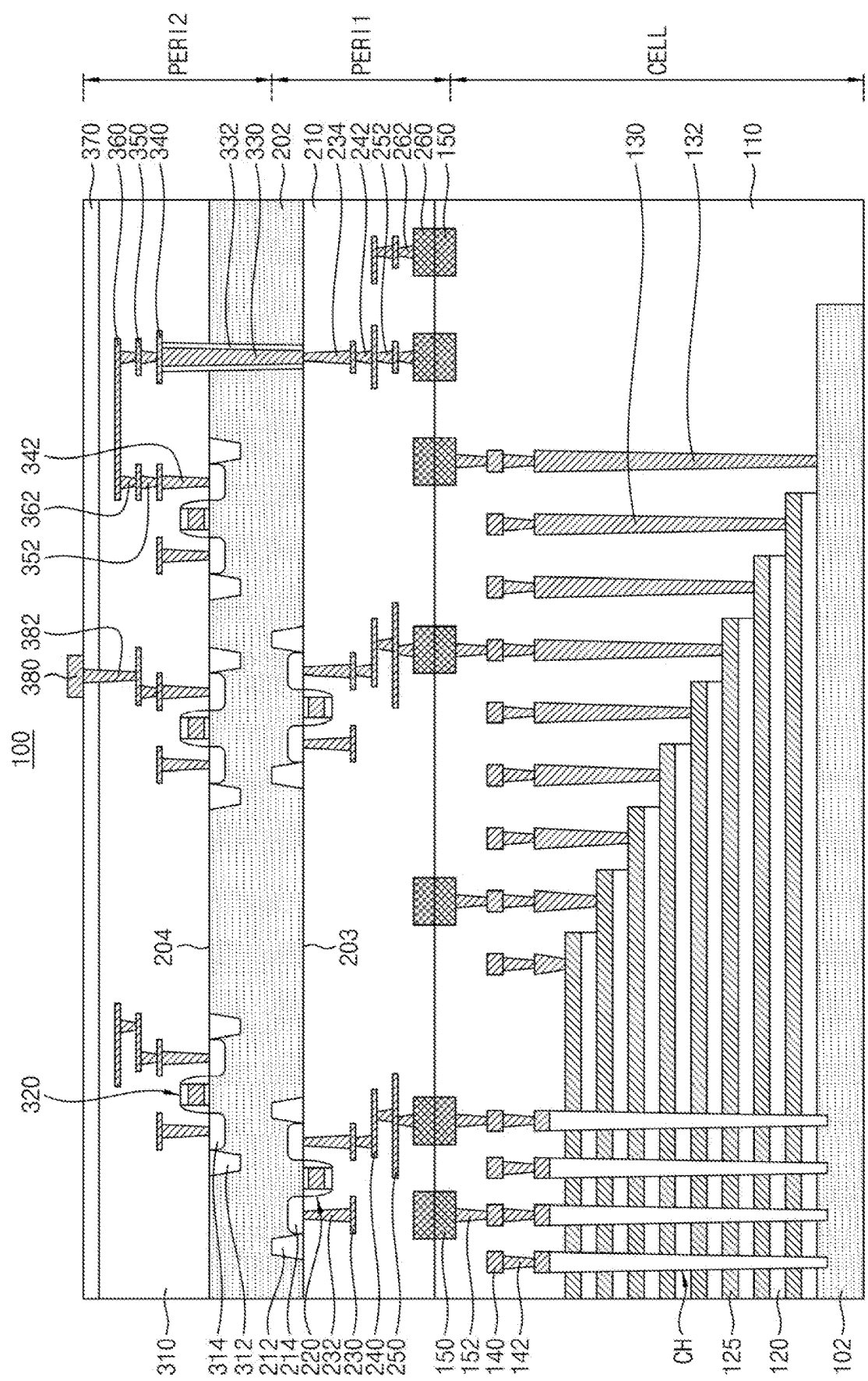
FIG. 4 is a cross-sectional view of a semiconductor device according to an exemplary embodiment.

FIG. 4 is a cross-sectional view of a semiconductor device according to an exemplary embodiment. A semiconductor device 100 according to the exemplary embodiment of the disclosure may include flash memory such as 3D-NAND. In the specification, the semiconductor device 100 may be referred to as a "semiconductor storage device".

Referring to FIG. 4, the semiconductor device 100 may have a chip-to-chip (C2C) structure. The C2C structure may mean that an upper chip including a cell area CELL is fabricated on a first wafer, a lower chip including a peripheral circuit area is fabricated on a second wafer different from the first wafer, and the upper chip and the lower chip are subsequently connected to each other through a bonding method. In an implementation, the bonding method may mean a method of electrically connecting a bonding metal formed at an uppermost metal layer of the upper chip and a bonding metal formed at an uppermost metal layer of the lower chip. In an implementation, when the bonding metals are made of copper (Cu), the bonding method may be a Cu—Cu bonding method. The bonding metals may be made of aluminum or tungsten.

The semiconductor device 100 may include a cell area CELL, a first peripheral circuit area PERI1, and a second peripheral circuit area PERI2. The cell area CELL may correspond to the cell area 1100S described in conjunction with FIG. 1, and the first peripheral circuit area PERI1 and the second peripheral circuit area PERI2 may correspond to the peripheral circuit area 1100F of FIG. 1.

The cell area CELL may include a first substrate 102, a cell area insulating layer 110, stack insulating layers 120, and gate electrodes 125. The first substrate 102 may include a semiconductor material. In an implementation, the first substrate 102 may be a silicon substrate, a germanium substrate, a silicon germanium substrate, or a silicon-on-insulator (SOI) substrate. In an implementation, the first substrate 102 may include a group IV semiconductor, a group III-V compound semiconductor, or a group II-VI oxide semiconductor. As used herein, the term "or" is not an exclusive term, e.g., "A or B" would include A, B, or A and B.

The stack insulating layers 120 and the gate electrodes 125 may constitute a memory stack. The gate electrodes 125 may extend (e.g., lengthwise) in a horizontal direction and may be spaced apart from one another in a vertical direction. The gate electrodes 125 may include the word lines WL, the first upper line UL1, the second upper line UL2, the first lower line LL1 and the second lower line LL2, which are shown in FIG. 1. The stack insulating layers 120 may be between (e.g., vertically) adjacent ones of the gate electrodes 125, respectively. The stack insulating layers 120 may also extend (e.g., lengthwise) in the horizontal direction and may be spaced apart from one another in the vertical direction. The stack insulating layers 120 may electrically insulate the gate electrodes 125 from one another.

The cell area CELL may further include channel structures CH, cell contact plugs 130, a through contact plug 132, wiring layers 140, contact plugs 142, and first bonding pads 150. Each channel structure CH may extend vertically through the memory stack. The channel structure CH may also partially extend through or into an upper surface of the first substrate 102. The channel structure CH may correspond to one cell string CSTR of FIG. 1. The channel structure CH may have a column shape, and may have a tapered shape such that the lateral width of the channel structure CH is gradually reduced as the channel structure CH extends toward or is closer to the first substrate 102.

The cell contact plugs 130 may be connected to the gate electrodes 125, respectively. The stack insulating layers 120 and the gate electrodes 125 may have a stepped structure. The cell contact plugs 130 may extend vertically through the cell area insulating layer 110 and, as such, may be connected to the stepped structure. The through contact plug 132 may extend vertically through the cell area insulating layer 110 such that the through contact plug 132 is connected to the first substrate 102.

The wiring layers 140 may be on the channel structures CH, the cell contact plugs 130, and the through contact plug 132, respectively. The channel structures CH, the cell contact plugs 130, and the through contact plug 132 may be connected to the wiring layers 140 by the contact plugs 142, respectively. The channel structures CH may be connected to the page buffer 1120 of the peripheral circuit area 1100F of FIG. 1. The cell contact plugs 130 and the through contact plug 132 may be connected to the row decoder 1110 of the peripheral circuit area 1100F of FIG. 1. The wiring layers 140 connected to the channel structures CH may correspond to the bit lines BL of FIG. 1, respectively.

The first bonding pads 150 may be at a top portion of the cell area CELL. In an implementation, an upper surface (e.g., surface facing away from the first substrate 102 in the vertical direction) of each first bonding pad 150 may be coplanar with an upper surface of the cell area insulating layer 110. The first bonding pads 150 may be connected to the first peripheral circuit area PERI1, and may be connected to corresponding ones of the wiring layers 140 via wiring contact plugs 152, respectively. The first bonding pads 150 may include a dummy pad.

The first peripheral circuit area PERI1 may be between the second peripheral circuit area PERI2 and the cell area CELL. The first peripheral circuit area PERI1 may include a second substrate 202, a first peripheral area insulating layer 210, first wiring layers 230, second wiring layers 240, third wiring layers 250, and second bonding pads 260. In an implementation, the second substrate 202 may include the same material as the first substrate 102. A surface of the second substrate 202 in the first peripheral circuit area PERI1 may be referred to as a "first surface 203". A surface of the second substrate 202 opposite to the first surface 203 and in the second peripheral circuit area PERI2 may be referred to as a "second surface 204". The first peripheral area insulating layer 210 may cover the first surface 203. A device isolation layer 212 and an impurity region 214 may be inside (e.g., may extend into the second substrate 202 at) the first surface 203. A device 220 may be on the first surface 203 adjacent to the impurity region 214. The device 220 may include an active device such as a transistor or a passive device such as an inductor, a resistor, or a capacitor.

The first wiring layers 230, the second wiring layers 240, and the third wiring layers 250 may be in the first peripheral area insulating layer 210. A corresponding one of the first wiring layers 230 may be connected to the impurity region 214 by a contact plug 232. Each second wiring layer 240 may be under a corresponding one of the first wiring layers 230, and may be connected to the corresponding first wiring layer 230 by a first wiring contact plug 242. Each third wiring layer 250 may be under a corresponding one of the second wiring layers 240, and may be connected to the corresponding second wiring layers 240 by a second wiring contact plug 252.

Each second bonding pad 260 may be connected to a corresponding one of the third wiring layers 250 by a third wiring contact plug 262, and may be under (e.g., at a bottom side of) the first peripheral area insulating layer 210. In an implementation, a lower surface (e.g., first substrate 102-facing surface) of each second bonding pad 260 may be coplanar with a lower surface of the first peripheral area insulating layer 210. Each second bonding pad 260 may be bonded to a corresponding one of the first bonding pads 150. In an implementation, each second bonding pad 260 may be connected to the corresponding first bonding pad 150 in a Cu—Cu bonding manner. The second bonding pads 260 may include a dummy pad. In an implementation, the dummy pad among the second bonding pads 260 may be connected to the dummy pad among the first bonding pads 150.

The second peripheral circuit area PERI2 may be on the first peripheral circuit area PERI1. The second peripheral circuit area PERI2 may include a second peripheral insulating layer 310, first wiring layers 340, second wiring layers 350, third wiring layers 360, an upper insulating layer 370, and an input/output pad 380. As described above, the second surface 204 of the second substrate 202 may be in the second peripheral circuit area PERI2. A device isolation layer 312 and an impurity region 314 may be inside the second surface 204 (e.g., may extend into the second substrate 202 at the second surface 204 thereof). A device 320 may be on the second surface 204 adjacent to the impurity region 314. In an implementation, a transistor of the device 320 in the second peripheral circuit area PERI2 may have a structure different from that of a transistor of the device 220 in the first peripheral circuit area PERI1. In an implementation, a gate electrode of the device 320 may include a material different from that of a gate electrode of the device 220. The device 320 may include a gate dielectric layer with a structure and/or a material different from that of a gate dielectric layer of the device 320. An operating voltage of the device 320 may differ from an operating voltage of the device 220.

The first wiring layers 340, the second wiring layers 350, and the third wiring layers 360 may be in the second peripheral area insulating layer 310. A corresponding one of the first wiring layers 340 may be connected to the impurity region 314 by a contact plug 342. Each second wiring layer 350 may be over a corresponding one of the first wiring layers 340, and may be connected to the corresponding first wiring layer 340 by a first wiring contact plug 352. Each third wiring layer 360 may be over a corresponding one of the second wiring layers 350, and may be connected to the corresponding second wiring layers 350 by a second wiring contact plug 362.

The semiconductor device 100 according to the exemplary embodiment of the disclosure may further include a through electrode 330 extending vertically through the second substrate 202, and a through electrode insulating layer 332 surrounding a side surface of the through electrode 330. The through electrode 330 may extend from the second peripheral area insulating layer 310 in the second peripheral circuit area PERI2 through the second substrate 202. In an implementation, an upper surface of the through electrode 330 may contact a corresponding one of the first wiring layers 340. In an implementation, the upper surface of the through electrode 330 may contact a corresponding one of the second wiring layers 350 or a corresponding one of the third wiring layers 360. In an implementation, a lower surface of the through electrode 330 may contact a through electrode plug 234, and may be connected to a corresponding one of the first wiring layer 230 by the through electrode plug 234. Accordingly, the second peripheral circuit area PERI2 may be electrically connected to the first peripheral circuit area PERI1 through the through electrode 330, and may also be electrically connected to the cell area CELL through the first peripheral circuit area PERI1.

The upper insulating layer 370 may be on the second peripheral area insulating layer 310. The input/output pad 380 may be on the upper insulating layer 370, and may be connected to a corresponding one of the third wiring layers 360 through an input/output contact plug 382. The input/output pad 380 may correspond to the chip pad 2210 of FIG. 2.

As shown in FIG. 4, the semiconductor device 100 may include the first peripheral circuit area PERI1 on the first surface 203 of the second substrate 202 and the second peripheral circuit area PERI2 on the second surface 204 of the second substrate 202 and, as such, may realize a wider variety of wiring interconnections in the semiconductor device 100, and may achieve a reduction in chip size in a horizontal direction.

FIG. 5 is an enlarged view of the semiconductor device shown in FIG. 4. FIG. 5 shows upper and lower portions of a channel structure CH.

Referring to FIG. 5, the channel structure CH may include an information storage layer 20, a channel layer 30, a buried insulating pattern 32, and a conductive pad 34. The channel layer 30 may be inside the information storage layer 20. The buried insulating pattern 32 may be inside the channel layer 30. The information storage layer 20 may include a tunnel insulating layer 22, a charge storage layer 24, and a blocking layer 26. The charge storage layer 24 may be inside the blocking layer 26. The tunnel insulating layer 22 may be inside the charge storage layer 24. The conductive pad 34 may be at the upper portion of the channel structure CH, and may be connected to the channel layer 30. In an implementation, the channel layer 30 may include polysilicon. The buried insulating pattern 32 may include silicon oxide, silicon nitride, silicon oxynitride, or a combination thereof. In an implementation, the blocking layer 26 and the tunnel insulating layer 22 may include silicon oxide, and the charge storage layer 24 may include silicon nitride.

A connecting conductive layer 43 may be at or on an upper surface of a first substrate 102, and may contact (e.g., directly contact) a side surface of the channel layer 30 while extending through the information storage layer 20. A portion of the connecting conductive layer 43, which contacts the channel layer 30, may extend in a vertical direction. A supporter 44 may be on the connecting conductive layer 43. The connecting conductive layer 43 and the supporter 44 may include polysilicon.

FIGS. 6 to 16 are cross-sectional views of stages in a method of manufacturing a semiconductor device shown in FIG. 4 according to an exemplary embodiment.

Figure 6:
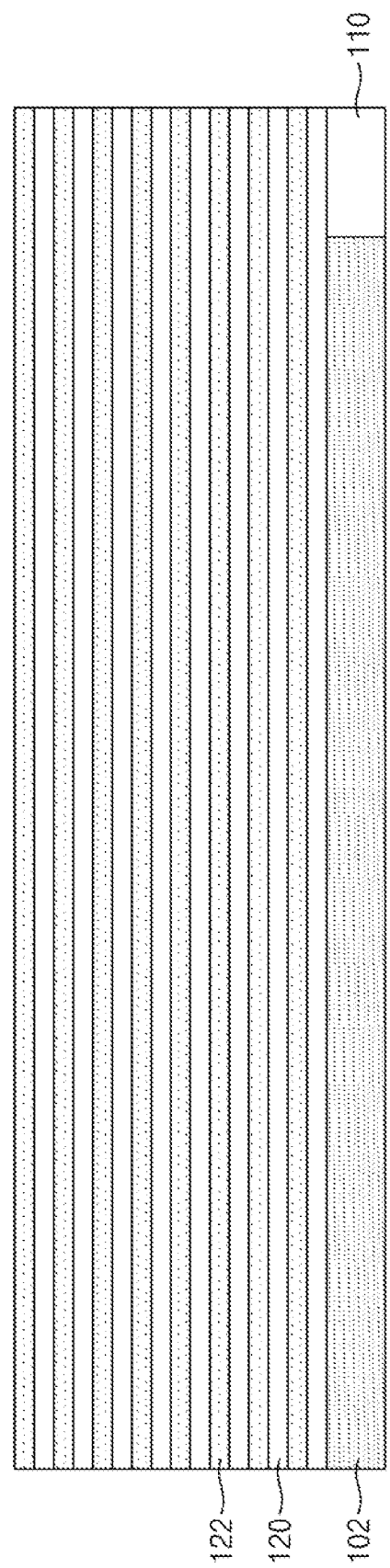
FIGS. 6 to 16 are cross-sectional views of stages in a method of manufacturing a semiconductor device shown in FIG. 4 according to an exemplary embodiment.

FIGS. 6 to 11 show formation of a structure corresponding to a cell area CELL. Referring to FIG. 6, a first substrate 102 and a cell area insulating layer 110 may be provided. The first substrate 102 may include a semiconductor material such as silicon. The cell area insulating layer 110 may be formed by patterning the first substrate 102, and then filling an insulating material. The cell area insulating layer 110 may include silicon oxide, silicon nitride, silicon oxynitride, or a combination thereof.

Stack insulating layers 120 and stack sacrificial layers 122 may be stacked on the first substrate 102 and the cell area insulating layer 110. The stack insulating layers 120 may include a material having etch selectivity with respect to the stack sacrificial layers 122. In an implementation, the stack insulating layers 120 may include silicon oxide, and the stack sacrificial layers 122 may include silicon nitride.

Figure 7:
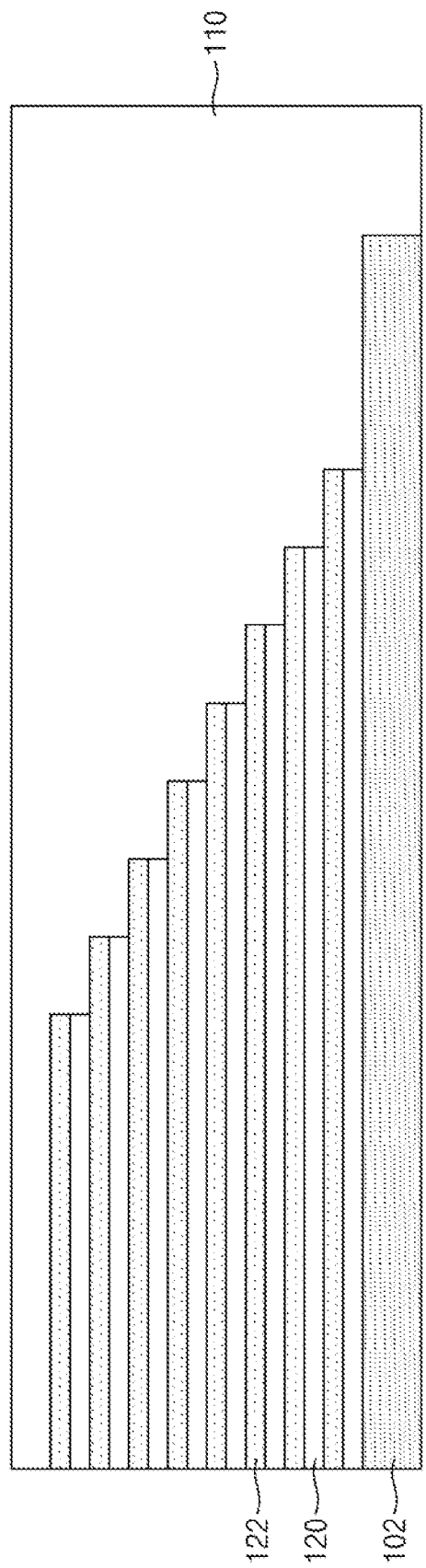

Referring to FIG. 7, the stack insulating layers 120 and the stack sacrificial layers 122 may be trimmed. In an implementation, the stack insulating layers 120 and the stack sacrificial layers 122 may be trimmed to have a stepped structure, through repetition of a photolithography process and an etching process. An insulating material may further be deposited such that the cell area insulating layer 110 covers the stack insulating layers 120 and the stack sacrificial layers 122.

Figure 8:
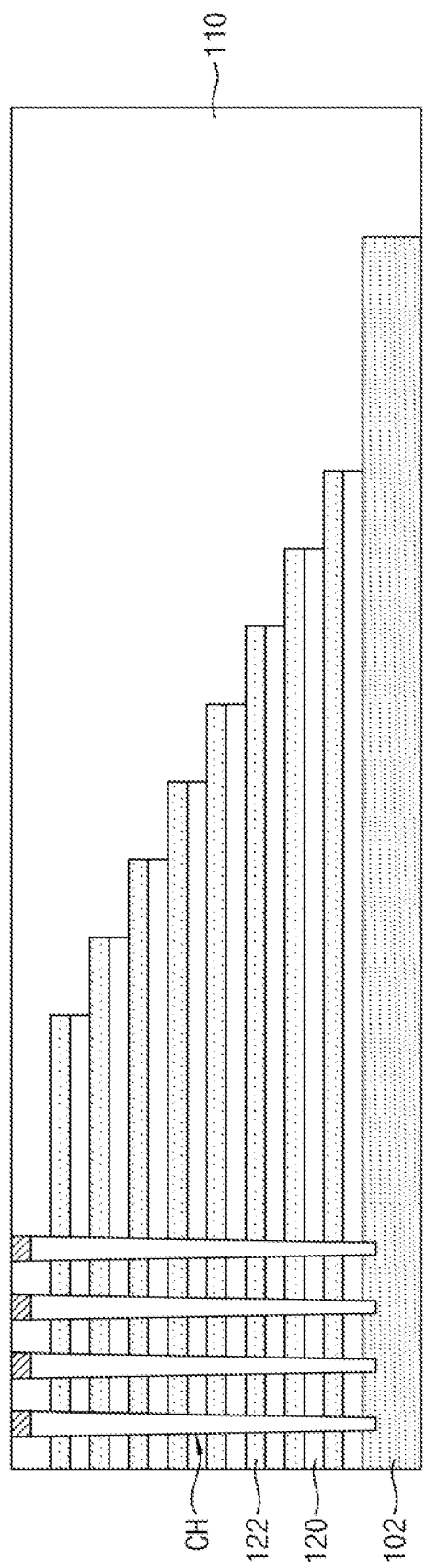

Referring to FIG. 8, channel structures CH extending vertically through the stack insulating layers 120 and the stack sacrificial layers 122 may be formed. In an implementation, channel holes extending vertically through the stack insulating layers 120 and the stack sacrificial layers 122 may be formed, and the channel holes may be filled with a channel material, thereby forming the channel structures CH. Each channel structure CH may have a column shape, and may have a tapered shape such that the lateral width of the channel structure CH is gradually reduced as the channel structure CH extends toward the first substrate 102.

Figure 9:
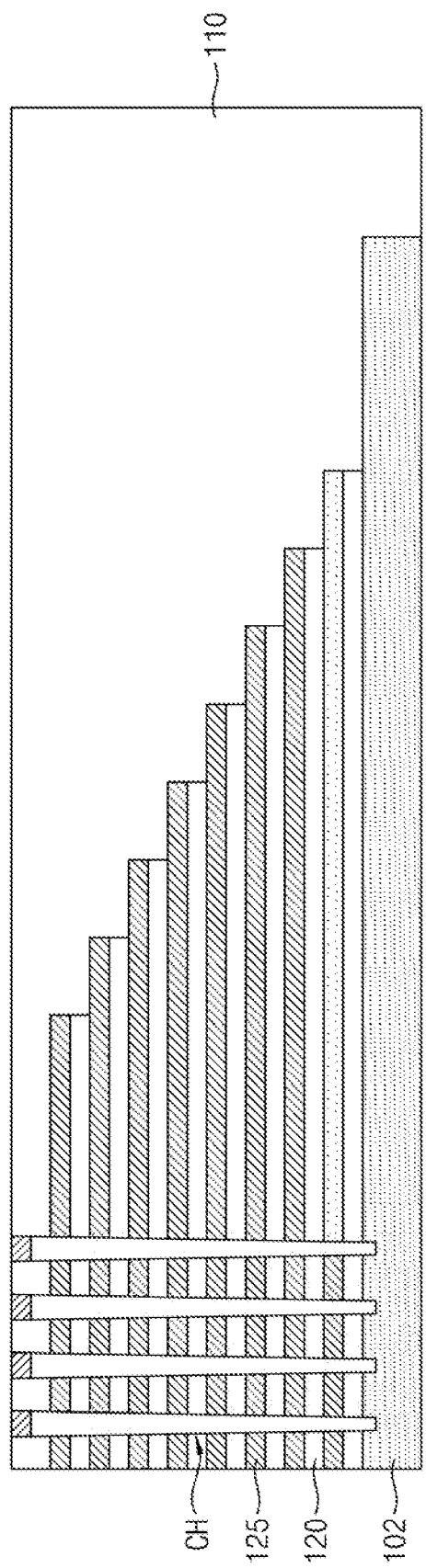

Referring to FIG. 9, the stack sacrificial layers 122 may be substituted by gate electrodes 125. In an implementation, a word line cut extending vertically through the stack insulating layers 120 and the stack sacrificial layers 122, and the stack sacrificial layers 122 may be selectively removed through the word line cut. The gate electrodes 125 may be filled in spaces formed through removal of the stack sacrificial layers 122, respectively. In an implementation, the gate electrodes 125 may include a metal such as tungsten, polysilicon, or a metal silicide material. The stack insulating layers 120 and the gate electrodes 125 may constitute a memory stack.

Figure 10:
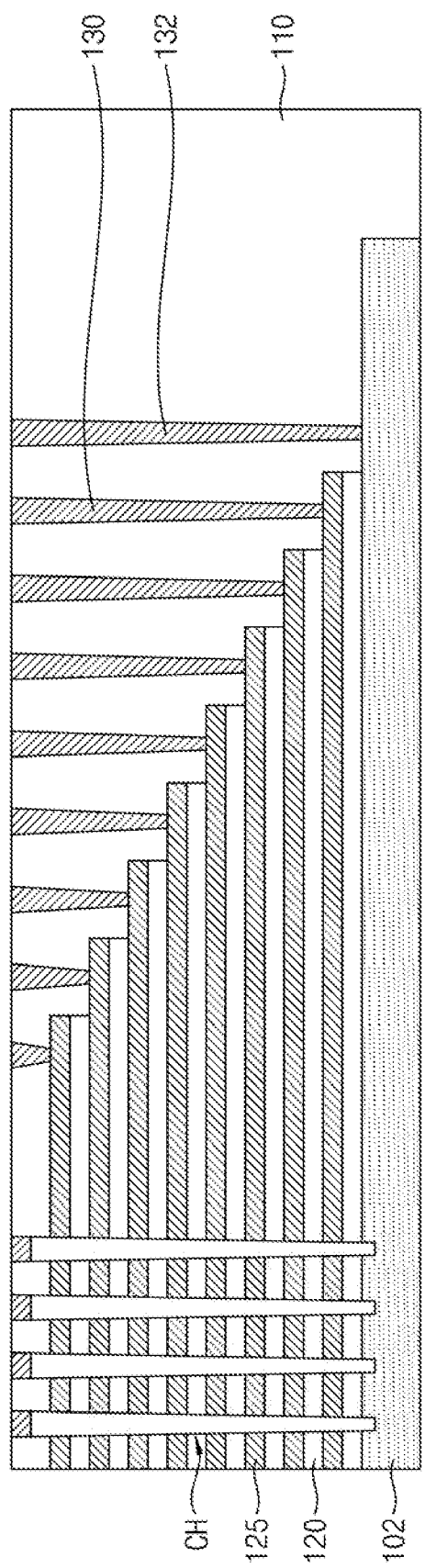

Referring to FIG. 10, cell contact plugs 130 and a through contact plug 132 extending vertically through the cell area insulating layer 110 may be formed. The cell contact plugs 130 and the through contact plug 132 may be formed by forming contact holes extending vertically through the cell area insulating layer 110, and then depositing a conductive material in the contact holes. The cell contact plugs 130 may be connected to the gate electrodes 125, respectively, and the through contact plug 132 may be connected to the first substrate 102.

Figure 11:
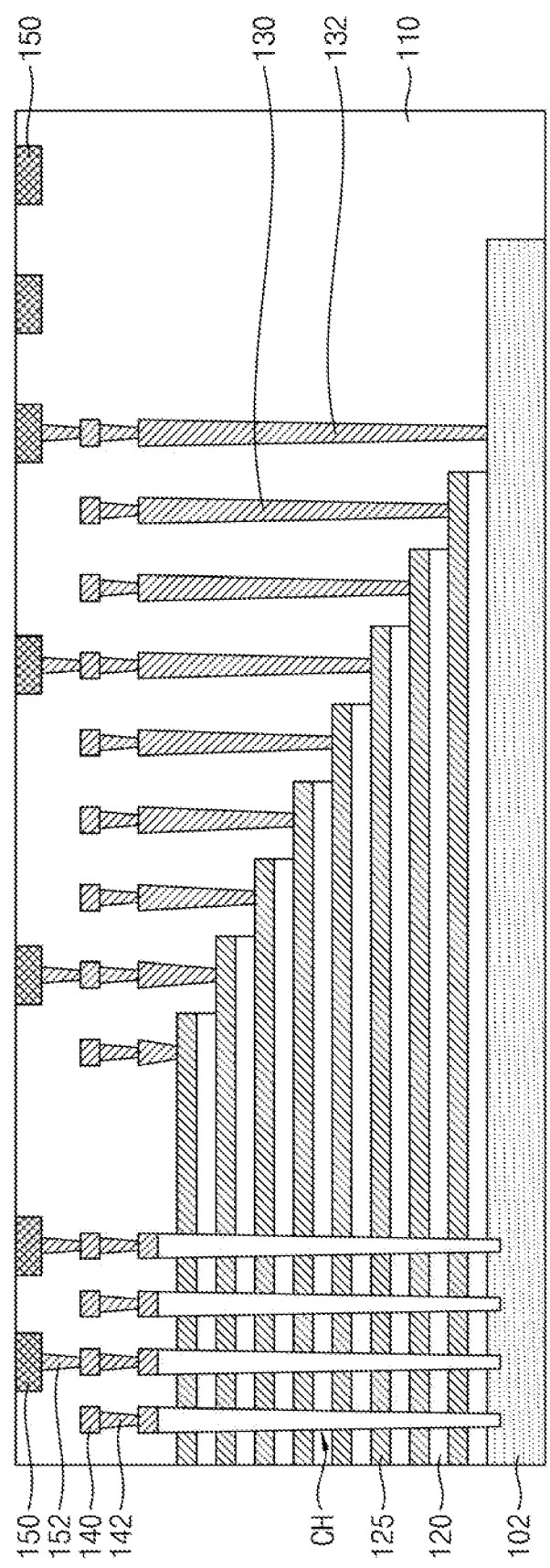

Referring to FIG. 11, wiring layers 140, contact plugs 142, first bonding pads 150, and wiring contact plugs 152 may be formed on the resultant structure of FIG. 10. The wiring layers 140, contact plugs 142, first bonding pads 150, and wiring contact plugs 152 may be formed by repeating processes of forming an insulating material layer on the resultant structure of FIG. 10, partially etching the insulating layer through a patterning process, and depositing a conductive material.

The wiring layers 140 may be connected to corresponding ones of the channel structures CH, the cell contact plugs 130 and the through contact plug 132, respectively. The first bonding pads 150 may be at a top portion of the cell area insulating layer 110. After formation of the first bonding pads 150, a planarization process may be performed. An upper surface of each first bonding pad 150 may not be covered by the cell area insulating layer 110.

Figure 12:
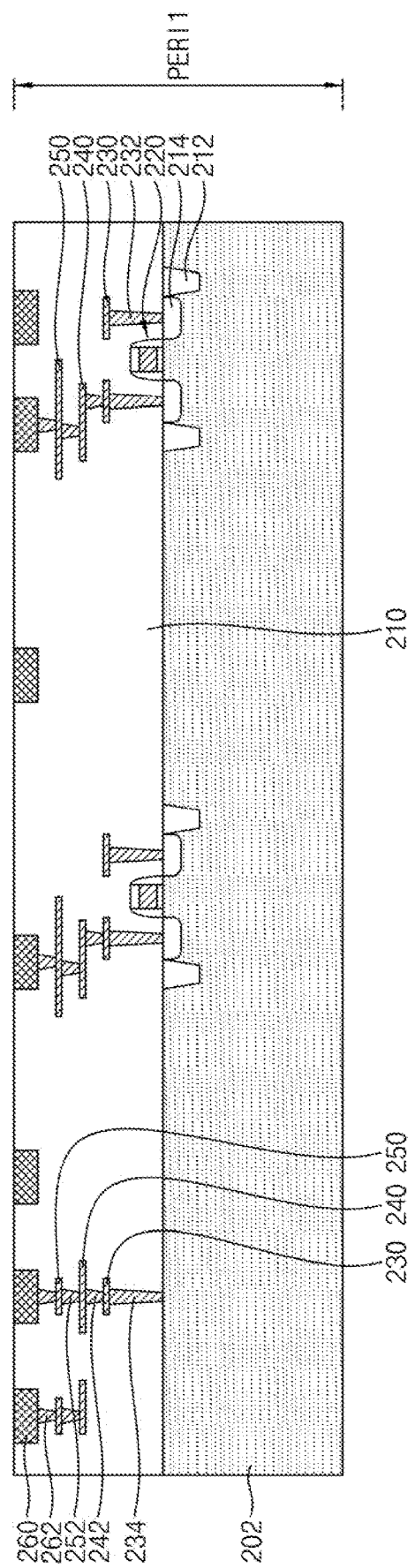

Referring to FIG. 12, a structure corresponding to a first peripheral circuit area PERI1 may be formed. First, a device isolation layer 212 and an impurity region 214 may be formed in a second substrate 202, and a device 220 may be formed on the second substrate 202. The device isolation layer 212 may be formed by depositing silicon oxide in the second substrate 202, and the impurity region 214 may be formed through an ion implementation process.

First wiring layers 230, contact plugs 232, a through electrode plug 234, second wiring layers 240, first wiring contact plugs 242, third wiring layers 250, second wiring contact plugs 252, second bonding pads 260 and third wiring contact plugs 262 may be formed on the second substrate 202. The contact plugs 232, the through electrode plug 234, the first wiring contact plugs 242, the second wiring contact plugs 252 and the third wiring contact plugs 262 may extend vertically between corresponding ones of the second substrate 202, the first wiring layers 230, the second wiring layers 240 and the third wiring layers 250. The first wiring layers 230, the contact plugs 232, the through electrode plug 234, the second wiring layers 240, the first wiring contact plugs 242, the third wiring layers 250, the second wiring contact plugs 252, the second bonding pads 260, and the third wiring contact plugs 262 may be formed by repeating processes of forming an insulating material layer on the second substrate 202, patterning the insulating material layer, and depositing a conductive material.

Figure 13:
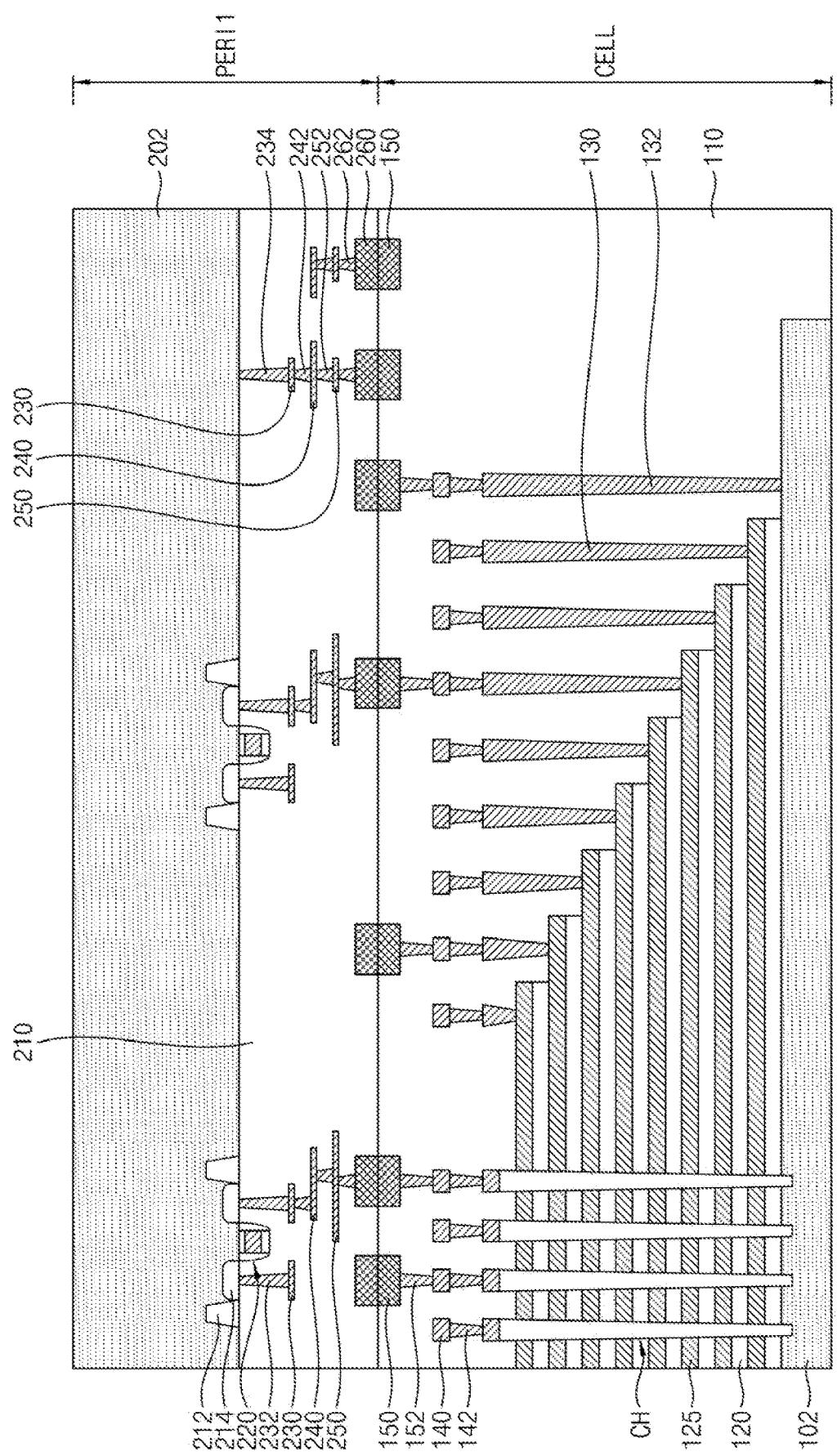

Referring to FIG. 13, the structure corresponding to the first peripheral circuit area PERI1 may be bonded to the structure corresponding to the cell area CELL through pressing. The structure corresponding to the first peripheral circuit area PERI1 may be bonded in an inverted state in which the second bonding pads 260 are directed downwards (e.g., toward the cell area CELL). The structures respectively corresponding to the first peripheral circuit area PERI1 and the cell area CELL may be bonded to each other without a separate adhesive therebetween. The first bonding pads 150 may be bonded to corresponding ones of the second bonding pads 260, respectively, and the cell area insulating layer 110 may be bonded to a first peripheral area insulating layer 210. A surface treatment process such as hydrogen plasma treatment may further be performed before the bonding process.

Figure 14:
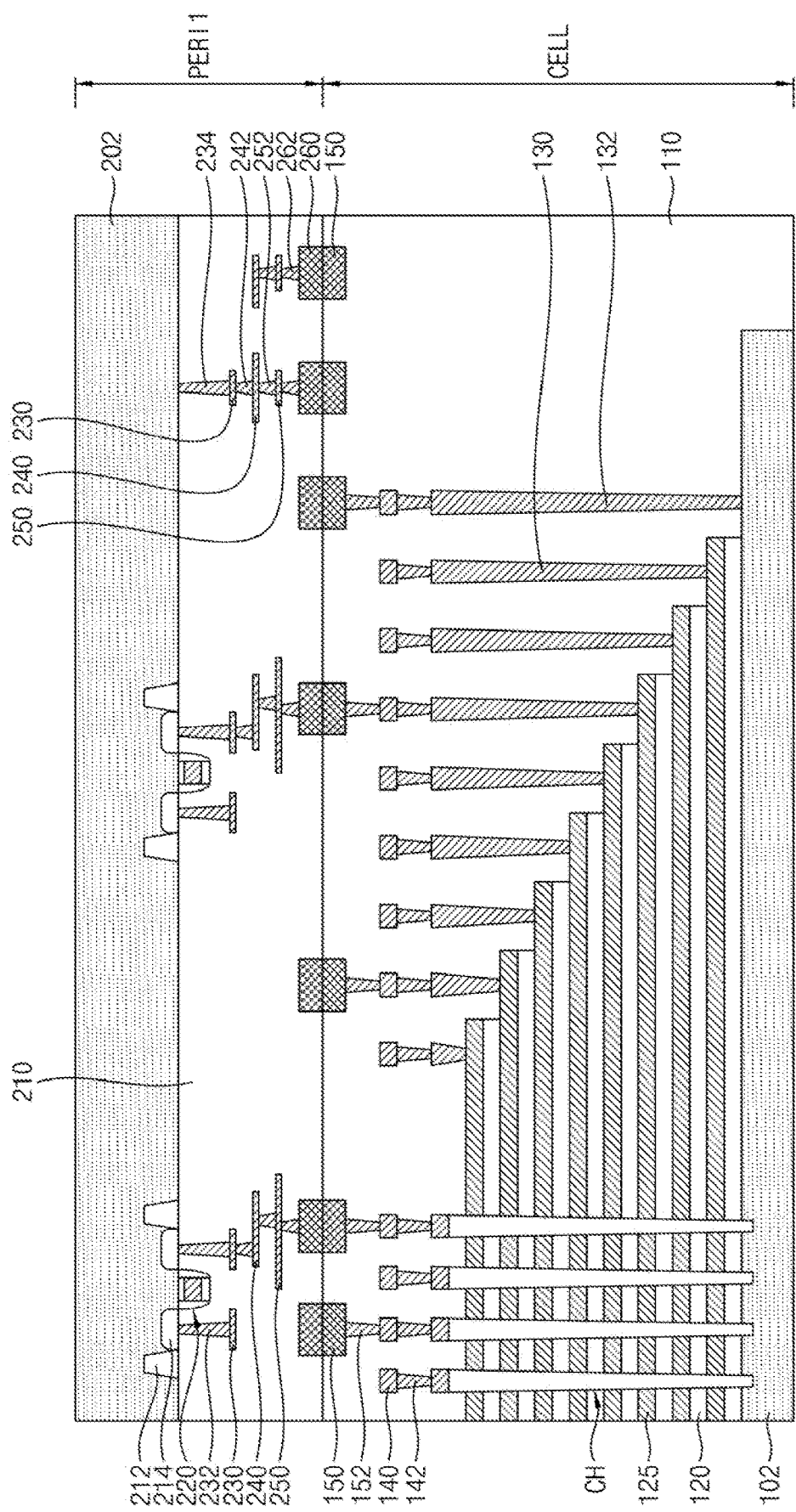

Referring to FIG. 14, an upper surface of the second substrate 202 may be partially etched. The etching process may be a process of planarizing the upper surface of the second substrate 202 and, as such, the thickness of the second substrate 202 may be reduced. In an implementation, the thickness of the etched second substrate 202 may be 300 nm to 3 μm.

Figure 15:
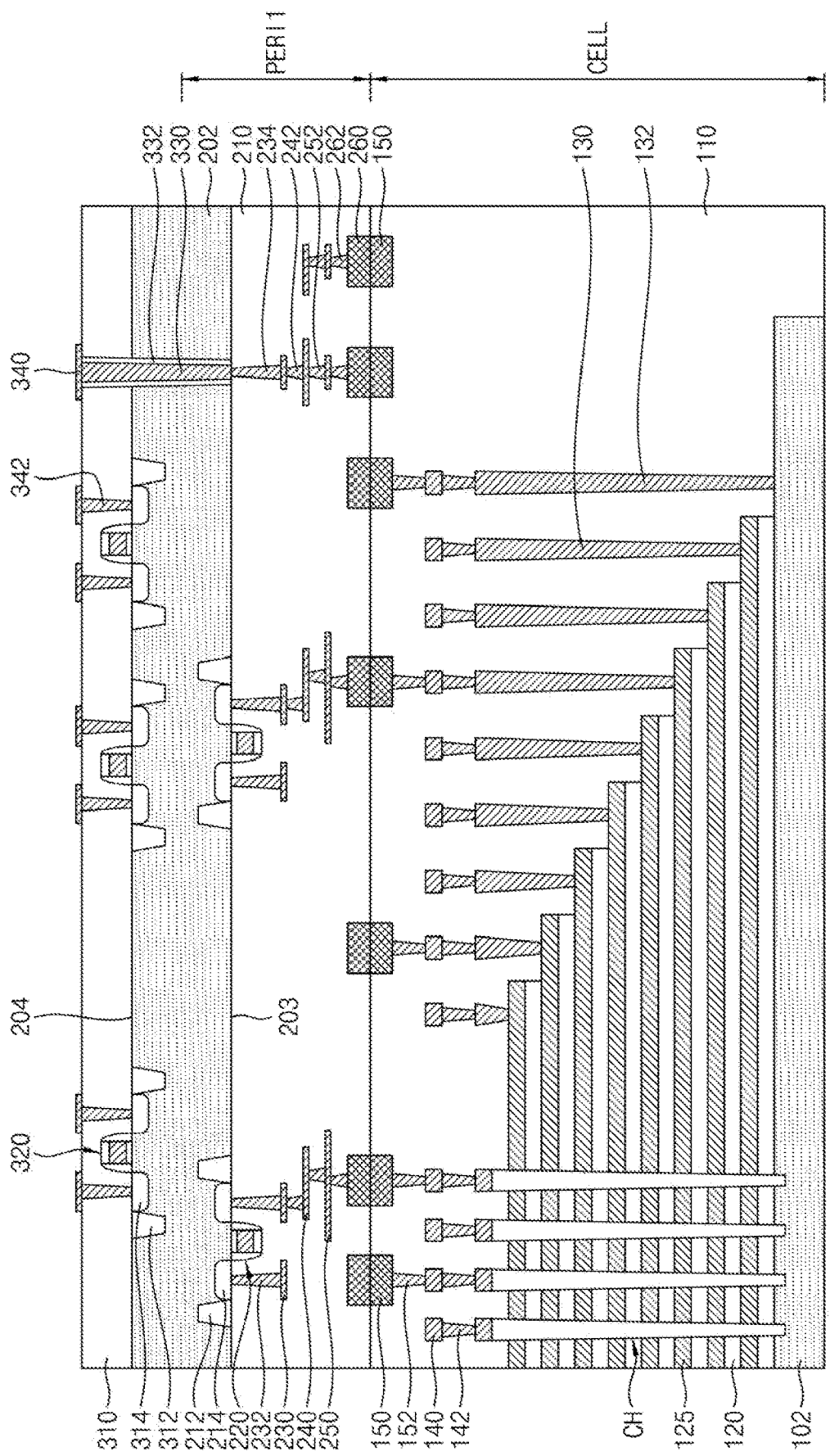
Figure 16:
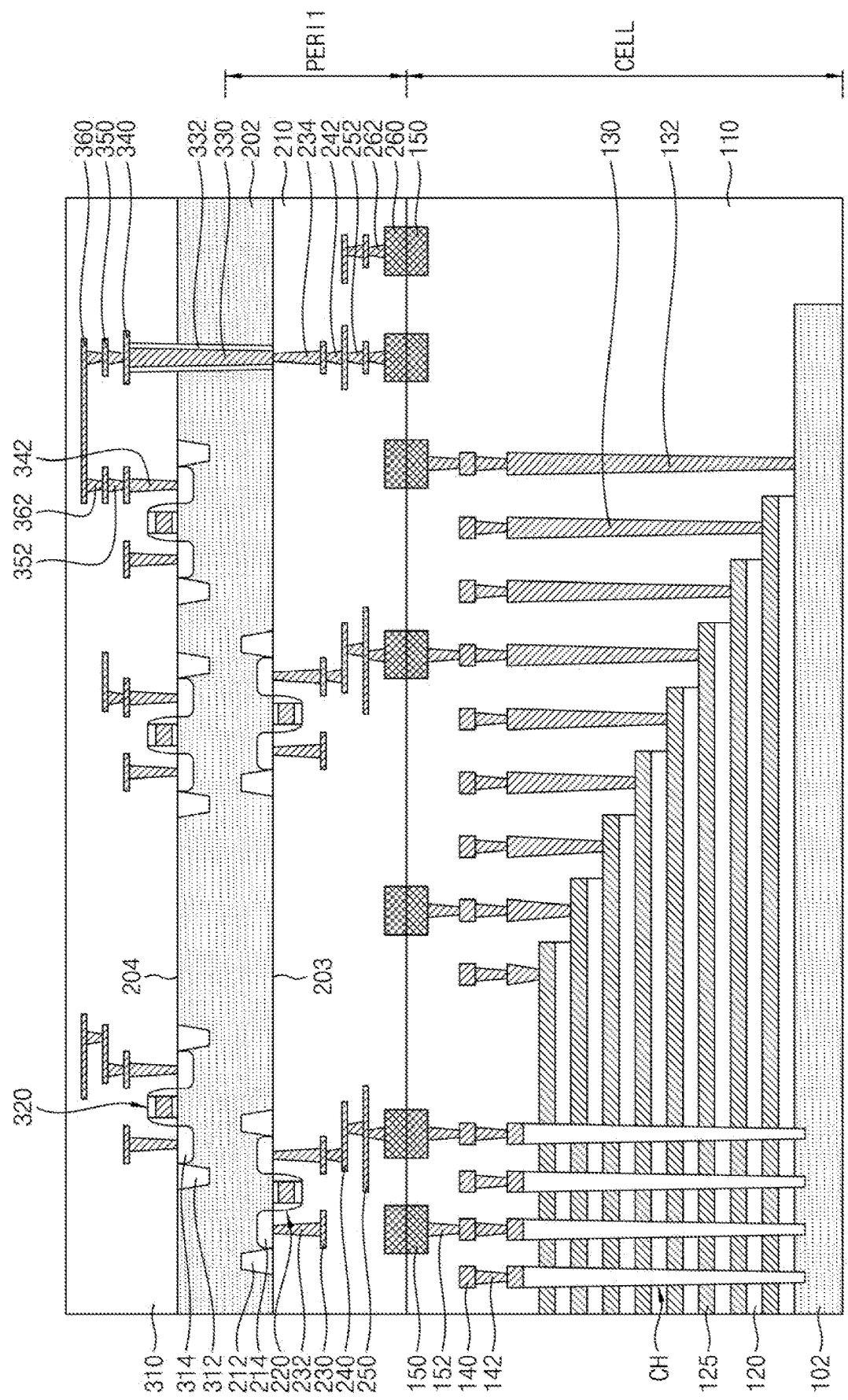

FIGS. 15 and 16 show formation of a structure corresponding to a second peripheral circuit area PERI2. As noted above, the surface of the second substrate 202 in the first peripheral circuit area PERI1 may be referred to as the "first surface 203", and a surface of the second substrate 202 opposite to the first surface 203 and in the second peripheral circuit area PERI2 may be referred to as the "second surface 204".

Referring to FIG. 15, a device isolation layer 312 and an impurity region 314 may be formed inside the second surface 204, and a device 320 and a second peripheral area insulating layer 310 may be formed on the second surface 204. Thereafter, contact plugs 342 and a through electrode 330, which extend vertically through the second peripheral area insulating layer 310, may be formed. The contact plugs 342 and the through electrode 330 may be formed by anisotropically etching the second peripheral area insulating layer 310, and depositing a conductive material. The through electrode 330 may be formed to extend through the second substrate 202 such that the through electrode 330 contacts the through electrode plug 234. The through electrode 330 may have a column shape, and may have a tapered shape such that the lateral width of the through electrode 330 is gradually reduced as the through electrode 330 extends from the second surface 204 to the first surface 203. In an implementation, a through electrode insulating layer 332 may be formed before formation of the through electrode 330 in order to electrically insulate the second substrate 202 and the through electrode 330 from each other.

First wiring layers 340 may be formed on the second peripheral area insulating layer 310 such that the first wiring layers 340 are connected to corresponding ones of the contact plugs 342 and the through electrode 330, respectively.

Referring to FIG. 16, second wiring layers 350, first wiring contact plugs 352, third wiring layers 360, and second wiring contact plugs 362 may be formed on the resultant structure of FIG. 15. The second wiring layers 350, the first wiring contact plugs 352, the third wiring layers 360, and the second wiring contact plugs 362 may be formed by repeating processes of forming an insulating material layer on the resultant structure of FIG. 15, patterning the insulating material layer, and depositing a conductive material.

Referring back to FIG. 4, an upper insulating layer 370, an input/output pad 380 and an input/output contact plug 382 may be formed. The upper insulating layer 370 may be formed by depositing an insulating material on the second peripheral area insulating layer 310. The input/output contact plug 382 may be formed by anisotropically etching the second peripheral area insulating layer 310 and the upper insulating layer 370, and depositing a conductive material. The input/output pad 380 may be formed on the input/output contact plug 382.

Figure 17:
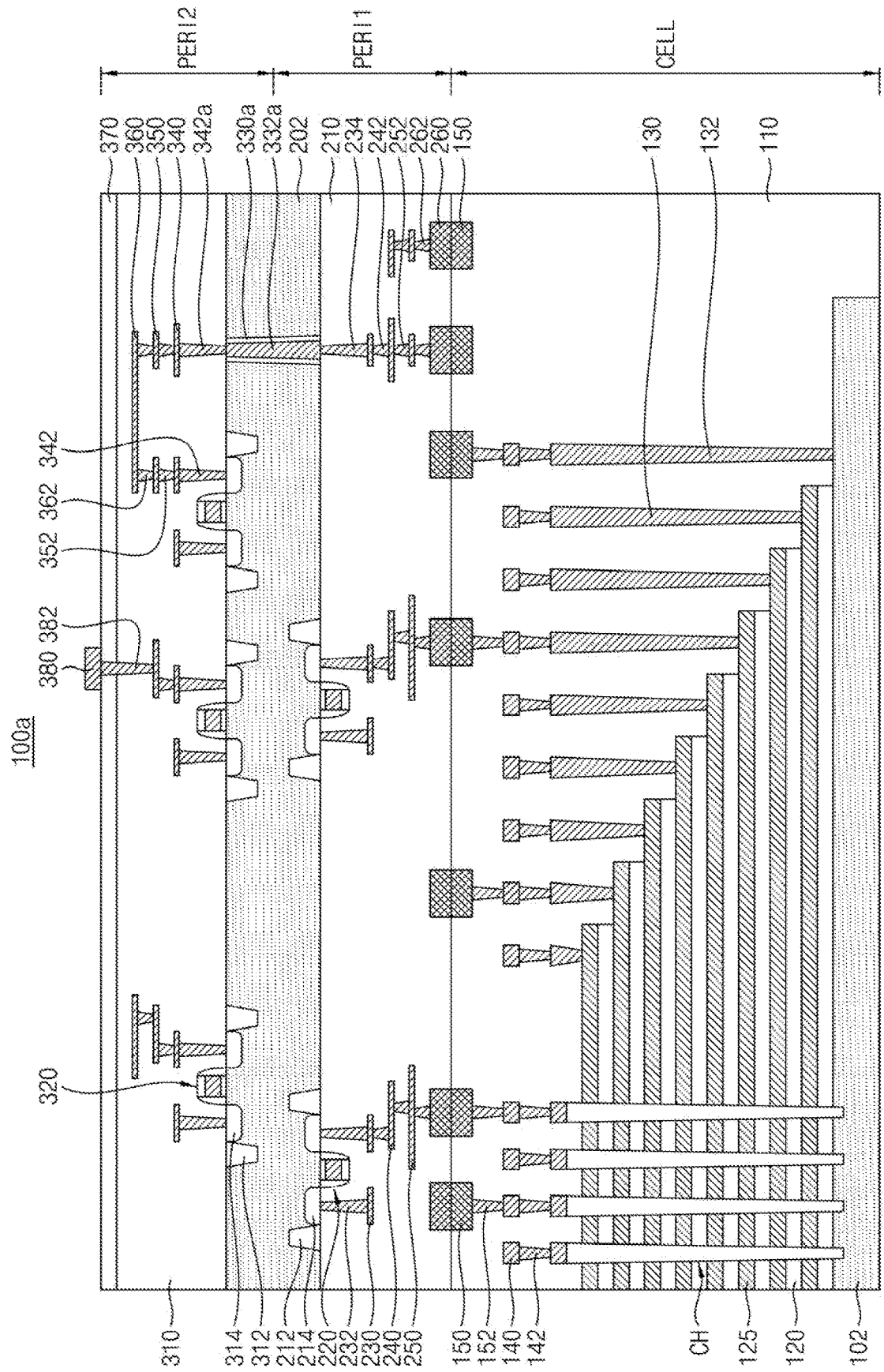
FIG. 17 is a cross-sectional view of a semiconductor device according to an exemplary embodiment.

FIG. 17 is a cross-sectional view of a semiconductor device according to an exemplary embodiment. Detailed descriptions of components that are the same as or similar to those of the semiconductor device 100 of FIG. 4 may be omitted.

Referring to FIG. 17, a semiconductor device 100a may include a through electrode 330a extending vertically through a second substrate 202 and electrically connecting a first peripheral circuit area PERI1 and a second peripheral circuit area PERI2 to each other, and a through electrode insulating layer 332a surrounding a side surface of the through electrode 330a. The through electrode 330a may have a tapered shape such that the lateral width of the through electrode 330a is gradually reduced as the through electrode 330a extends from the first surface 203 to the second surface 204. An upper surface of the through electrode 330a may contact a through electrode plug 342a connected to a first wiring layer 340. A lower surface of the through electrode 330a may contact a through electrode plug 234 connected to a first wiring layer 230. The upper surface of the through electrode 330a may be substantially coplanar with the second surface 204, whereas the lower surface of the through electrode 330a may be substantially coplanar with the first surface 203.

FIGS. 18 to 21 are cross-sectional views of stages in a method of manufacturing a semiconductor device shown in FIG. 17 according to an exemplary example embodiment.

Figure 18:
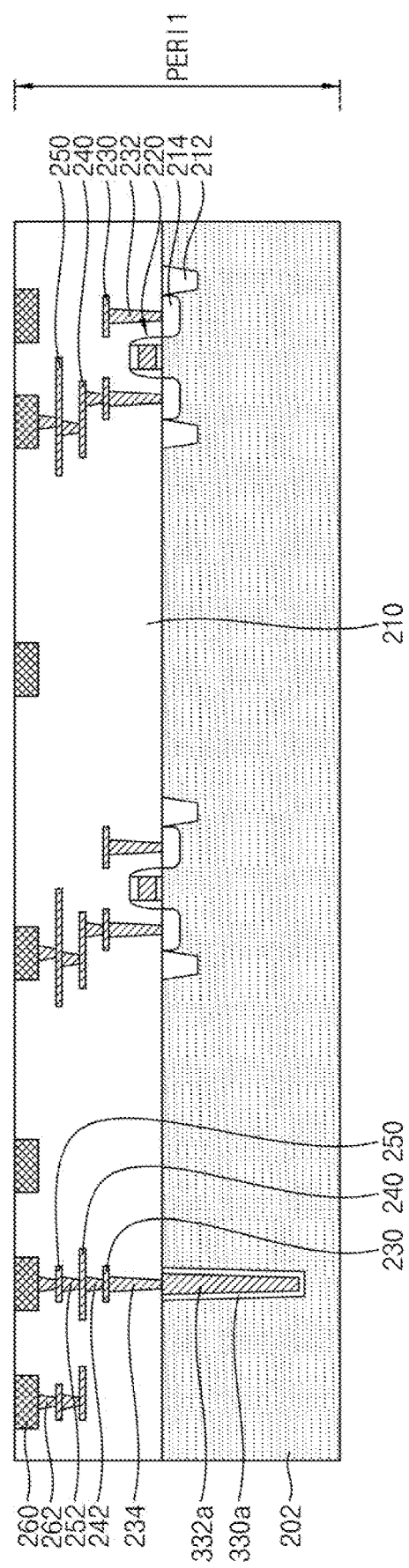
FIGS. 18 to 21 are cross-sectional views of stages in a method of manufacturing a semiconductor device shown in FIG. 17 according to an exemplary example embodiment.

Referring to FIG. 18, a structure corresponding to a first peripheral circuit area PERI1 may be formed. A through electrode 330a extending vertically in a second substrate in the first peripheral circuit area PERI1 and a through electrode insulating layer 332a surrounding a side surface of the through electrode 330a may be formed. The through electrode 330a and the through electrode insulating layer 332a may be formed by anisotropically etching the second substrate 202, and depositing an insulating material and a conductive material.

Figure 19:
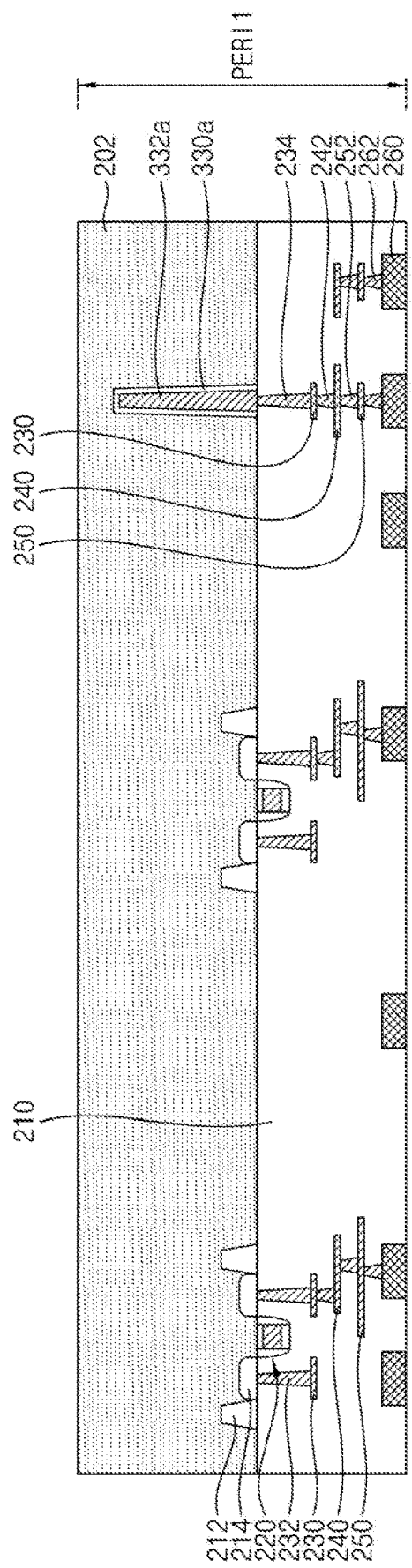

Referring to FIG. 19, the structure corresponding to the first peripheral circuit area PERI1 may be bonded to a structure corresponding to a cell area CELL.

Figure 20:
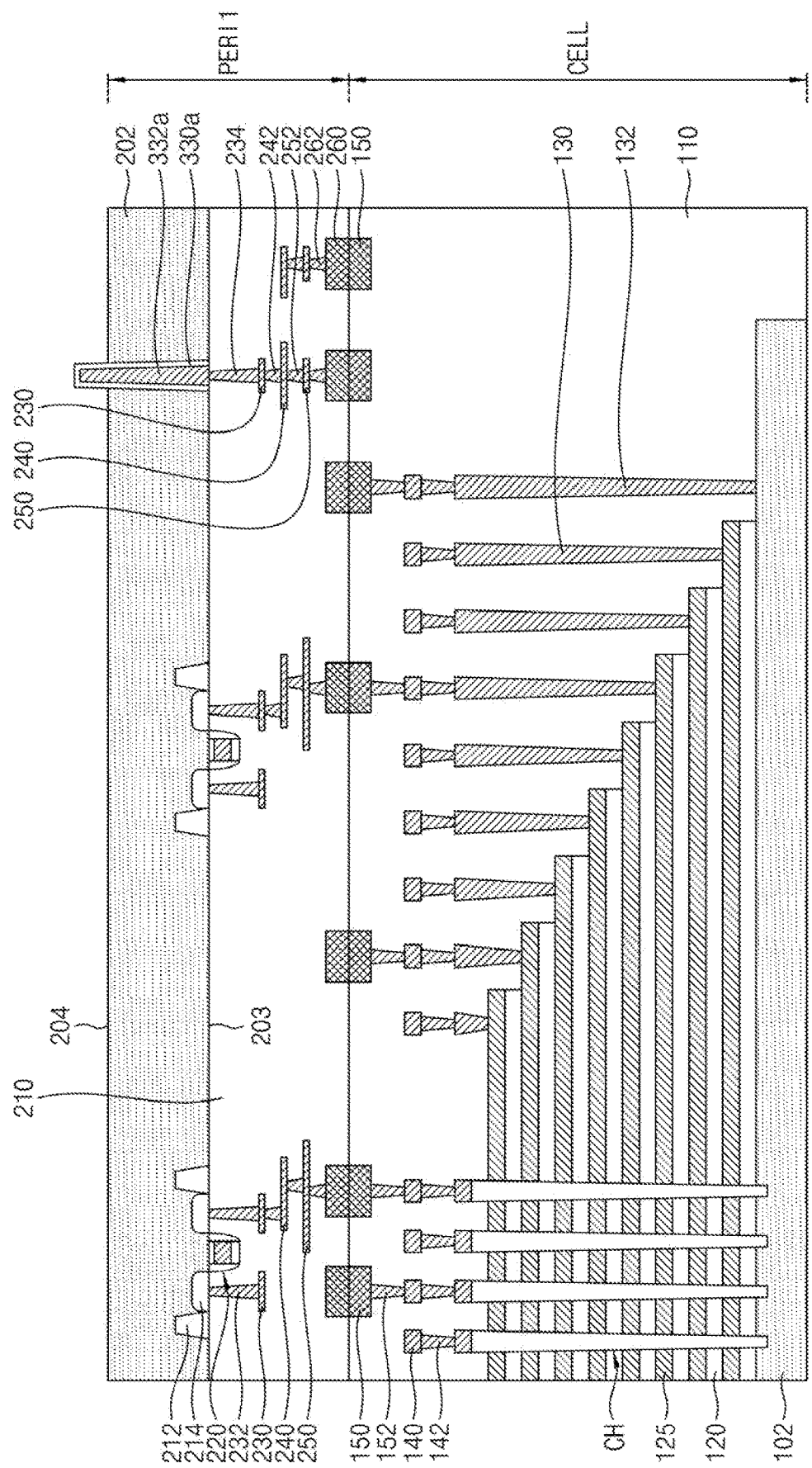

Referring to FIG. 20, after bonding of the structure corresponding to the first peripheral circuit area PERI1, an upper surface of the second substrate 202 opposite to a first surface 203 may be etched such that the through electrode 330a is partially exposed. The process of etching the second substrate 202 may include a planarization process and an etch-back process. In an implementation, the thickness of the etched second substrate 202 may be 300 nm to 3 μm.

Figure 21:
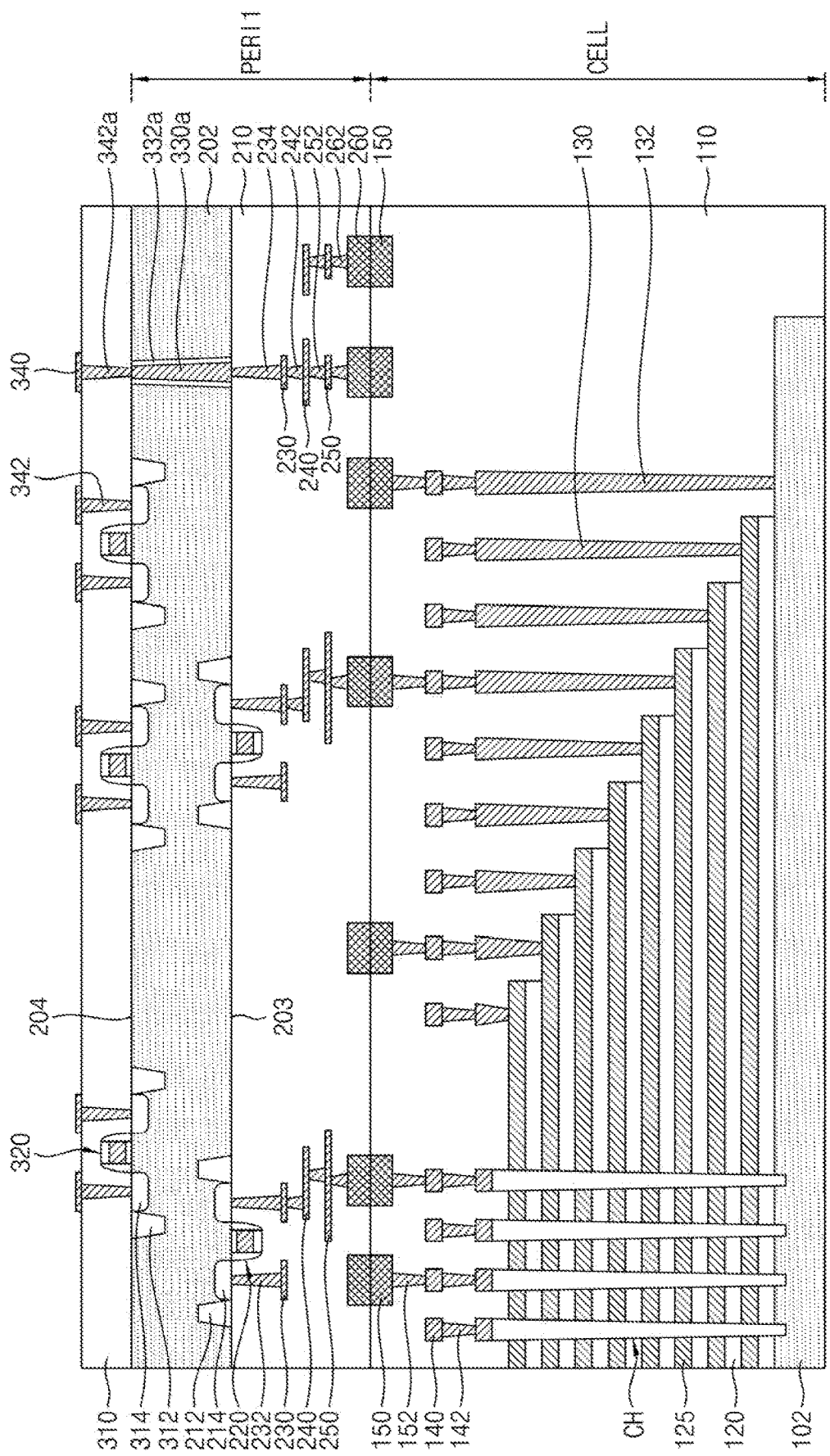

Referring to FIG. 21, the exposed through electrode 330a may be planarized. A second peripheral area insulating layer 310, a device isolation layer 212, an impurity region 214, a transistor, first wiring layers 230, and contact plugs may be formed on a second surface 204 of the second substrate 202.

Again referring to FIG. 17, the first wiring layers 230, second wiring layers 240, third wiring layers 250, an input/output pad 380, and plugs connecting corresponding ones of the first wiring layers 230, the second wiring layers 240, the third wiring layers 250, and the input/output pad 380 may be formed and, as such, a second peripheral circuit area PERI2 may be formed.

FIGS. 22 to 29 are cross-sectional views of semiconductor devices according to exemplary embodiments.

Figure 22:
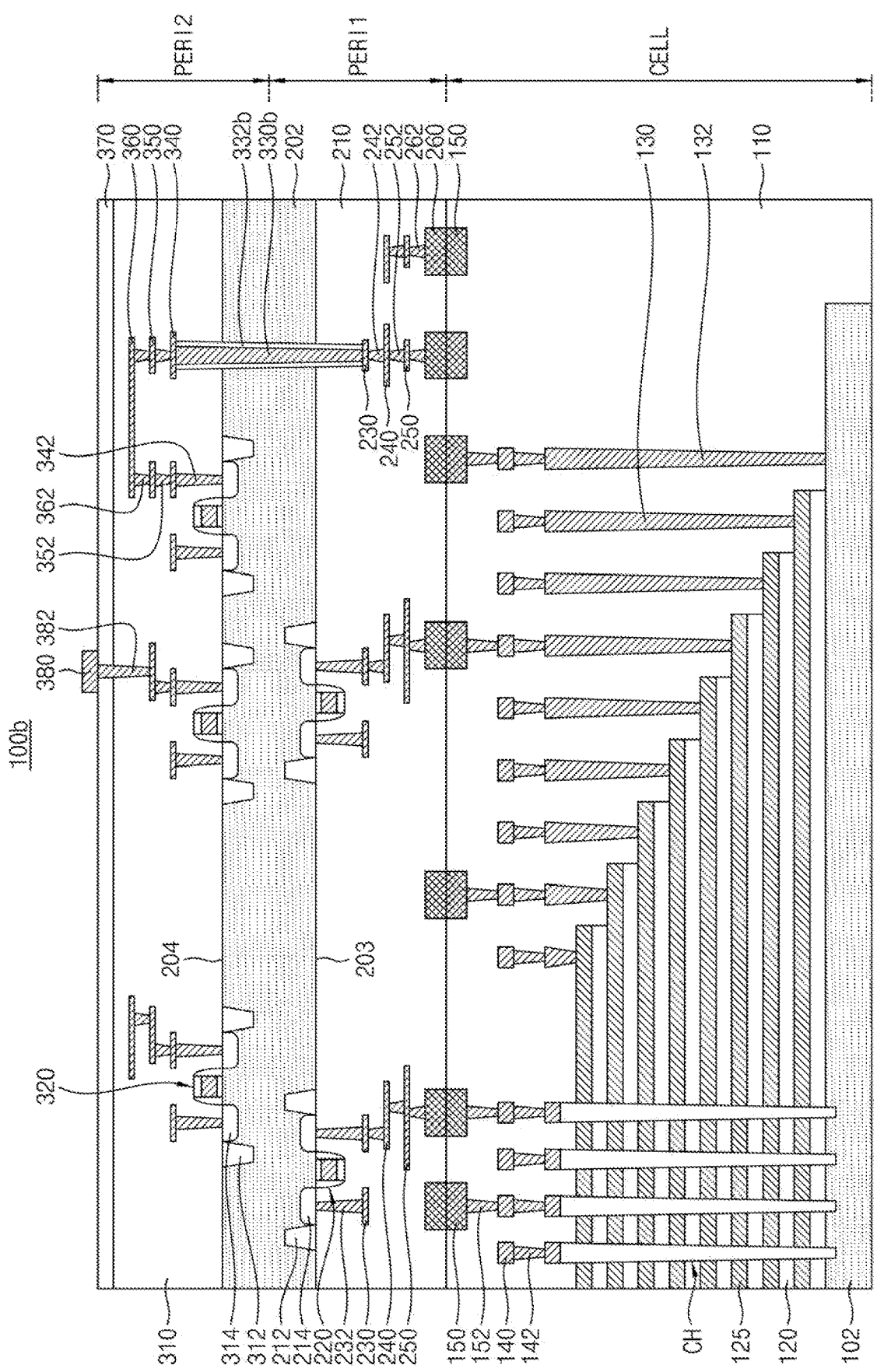
FIGS. 22 to 29 are cross-sectional views of semiconductor devices according to exemplary embodiments.

Referring to FIG. 22, a semiconductor device 100b may include a through electrode 330b extending vertically through a second substrate 202 and electrically connecting a first peripheral circuit area PERI1 and a second peripheral circuit area PERI2 to each other, and a through electrode insulating layer 332b surrounding a side surface of the through electrode 330b. In an implementation, the through electrode 330b may extend partially through a first peripheral area insulating layer 210 and, as such, may be connected to a first wiring layer 230 of the first peripheral circuit area PERI1. An upper surface of the through electrode 330b may contact a first wiring layer 340, and a lower surface of the through electrode 330b may contact the first wiring layer 230.

Figure 23:
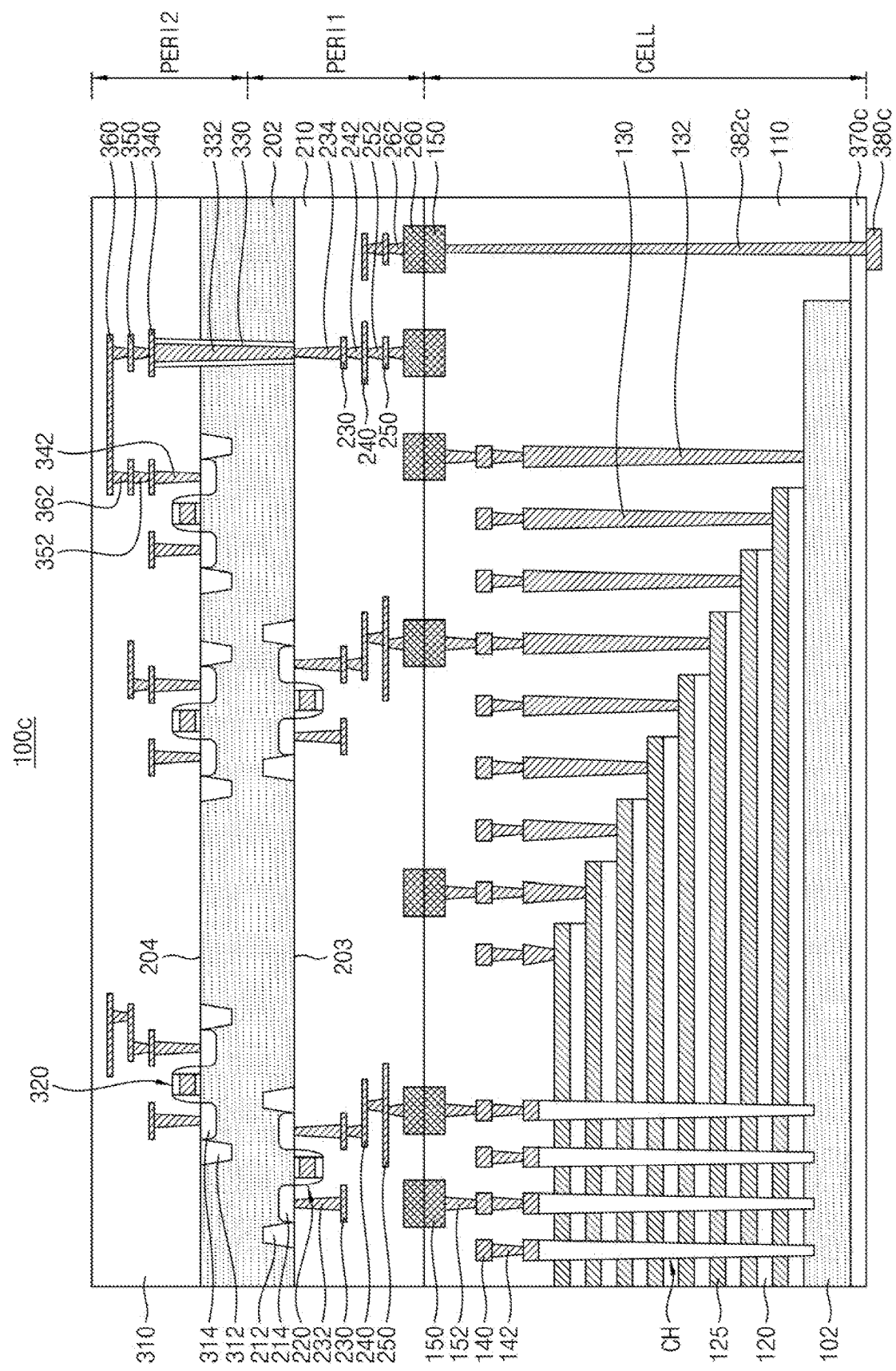

Referring to FIG. 23, a semiconductor device 100c may include a lower insulating layer 370c, an input/output pad 380c, and an input/output contact plug 382c. In an implementation, the input/output pad 380c may be in the cell area CELL. In an implementation, the lower insulating layer 370c may be under the first substrate 102, and the input/output pad 380c may be under the lower insulating layer 370c. The input/output pad 380c may be connected to a first bonding pad 150 by the input/output contact plug 382c which extends through the cell area insulating layer 110 and the lower insulating layer 370c. In an implementation, the semiconductor device 100c may only include the input/output pad 380c, as illustrated in FIG. 23. In an implementation, the semiconductor device 100c may include both the input/output pad 380c and the input/output pad 380 of FIG. 4.

Figure 24:
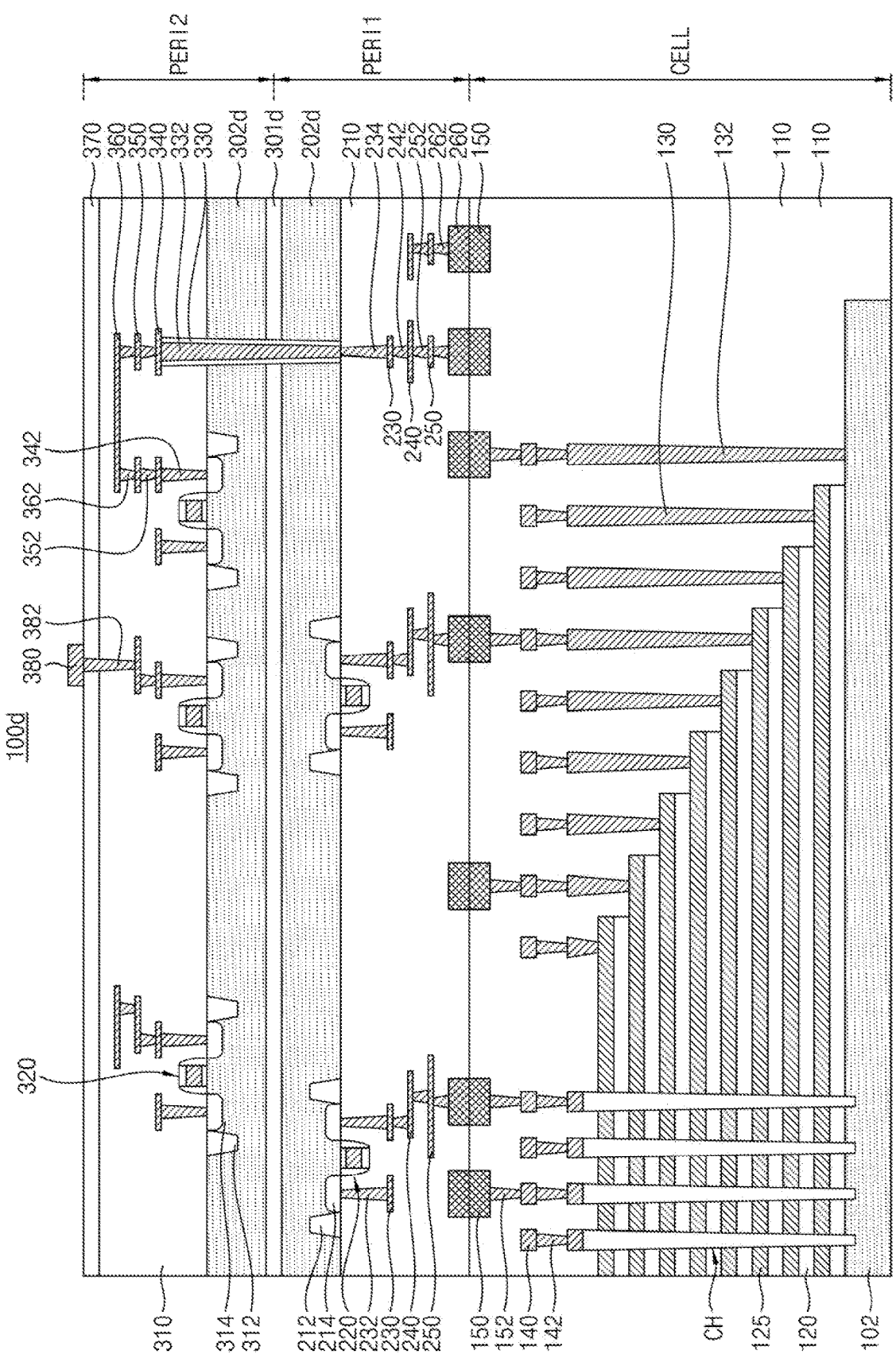

Referring to FIG. 24, a semiconductor device 100d may include a second lower substrate 202d, a buried insulating layer 301d, and a second upper substrate 302d. Referring to FIGS. 14 to 16, in an embodiment, after bonding of the first peripheral circuit area PERI1, the second substrate 202 is etched, and an insulating material and a silicon substrate may then be deposited. The structure corresponding to the second peripheral circuit area PERI2 may be formed on the silicon substrate. In an implementation, the second lower substrate 202d may include the same material as the second substrate 202. The buried insulating layer 301d may include silicon oxide, silicon nitride, silicon oxynitride, or a combination thereof. The second upper substrate 302d may include polysilicon.

Figure 25:
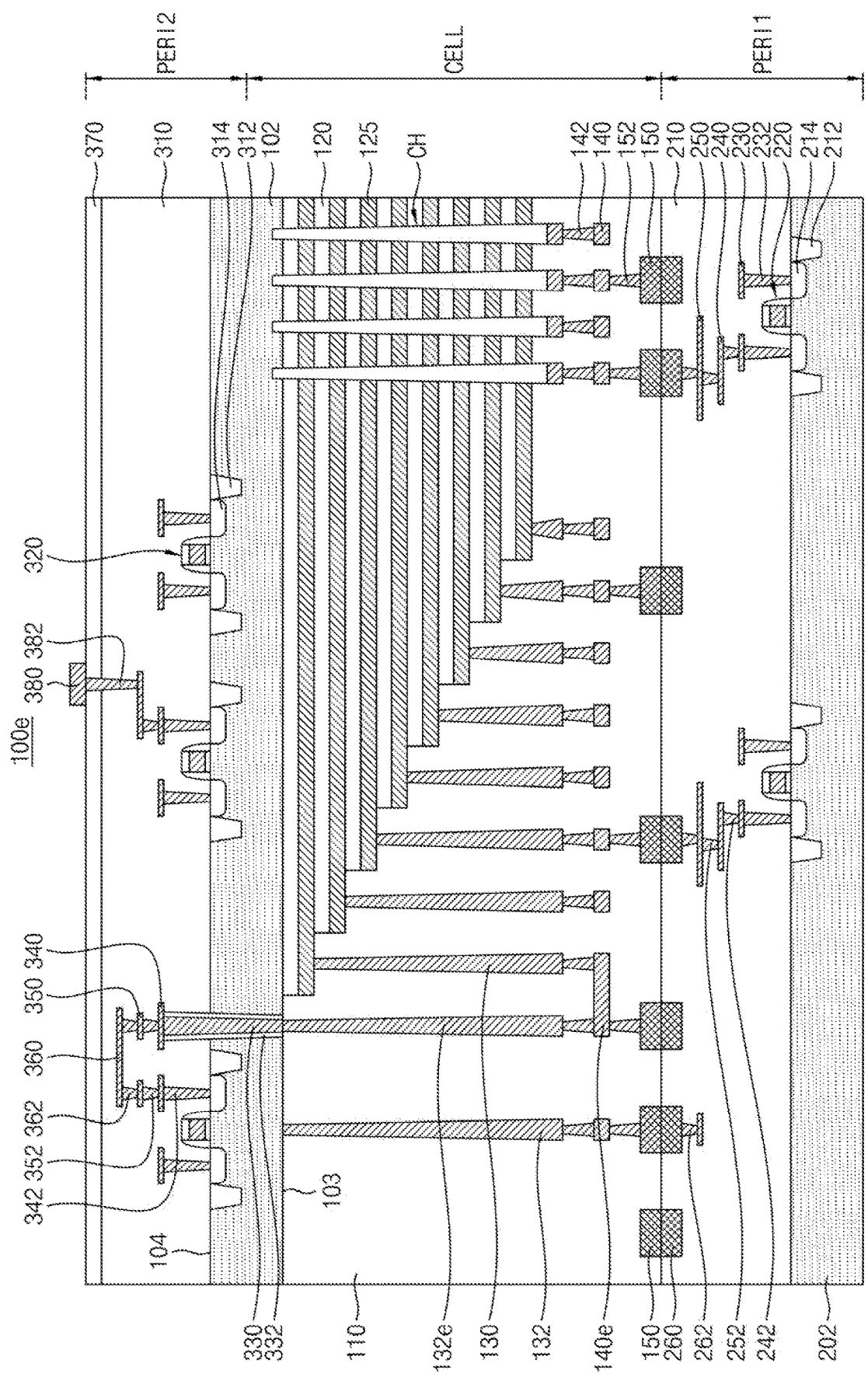

Referring to FIG. 25, a semiconductor device 100e may include a cell area CELL, a first peripheral circuit area PERI1 under the cell area CELL, and a second peripheral circuit area PERI2 over the cell area CELL (e.g., on an opposite side relative to the first peripheral circuit area PERI1). The cell area CELL and the first peripheral circuit area PERI1 may include configurations identical or similar to those of the cell area CELL and the first peripheral circuit area PERI1 in FIG. 4. In an implementation, wiring structures in the cell area CELL and the first peripheral circuit area PERI1 in FIG. 25 may be partially different from those of the cell area CELL and the first peripheral circuit area PERI1 in FIG. 4.

The cell area CELL may be connected to the first peripheral circuit area PERI1 in an inverted state in which first bonding pads 150 are directed downwards. In an implementation, the cell area CELL may include first bonding pads 150 under a cell area insulating layer 110, and the first peripheral circuit area PERI1 may include second bonding pads 260 bonded to the first bonding pads 150, respectively, and may be on a first peripheral area insulating layer 210. A surface of a first substrate 102 in the cell area CELL may be referred to as a "first surface 103", and a surface of the first substrate 102 opposite to the first surface 103 may be referred to as a "second surface 104".

The cell area CELL may include cell contact plugs 130, a through contact plug 132e, and connecting wiring layers 140e. The cell contact plugs 130 may be connected to gate electrodes 125, respectively. The through contact plug 132e may be connected to the first substrate 102. The cell contact plugs 130 and the through contact plug 132e may be connected to the connecting wiring layers 140e via contact plugs 142, respectively.

A structure corresponding to the second peripheral circuit area PERI2 may be formed at the first substrate 102 of the cell area CELL after a structure corresponding to the cell area CELL is bonded to a structure corresponding to the first peripheral circuit area PERI1. In an implementation, the second peripheral circuit area PERI2 may be formed on the second surface 104 of the first substrate 102. The second peripheral circuit area PERI2 may include a device isolation layer 312 and an impurity region 314, which are inside the second surface 104, a device 320 on the second surface 104, first wiring layers 340, second wiring layers 350, third wiring layers 360, and an input/output pad 380. The second peripheral circuit area PERI2 may also include contact plugs 342, first wiring contact plugs 352, second wiring contact plugs 362, and an input/output contact plug 382, which connect corresponding ones of the first wiring layers 340, the second wiring layers 350, the third wiring layers 360, and the input/output pad 380, respectively.

The second peripheral circuit area PERI2 may further include a through electrode 330 connecting the second peripheral circuit area PERI2 and the cell area CELL. The through electrode 330 may have a tapered shape such that the lateral width of the through electrode 330 is gradually reduced as the through electrode 330 extends from the second surface 104 to the first surface 103. The through electrode 330 may electrically connect the second peripheral circuit area PERI2 to the cell area CELL. In an implementation, the through electrode 330 may vertically extend from a corresponding one of the first wiring layers 340 through the second peripheral area insulating layer 310 and the first substrate 102 such that the through electrode 330 contacts the through contact plug 132e. The through contact plug 132e may further be connected to corresponding ones of the connecting wiring layers 140e and the first bonding pads 150. Accordingly, the through contact plug 132e may electrically connect the second peripheral circuit area PERI2 to the first peripheral circuit area PERI1.

Figure 26:
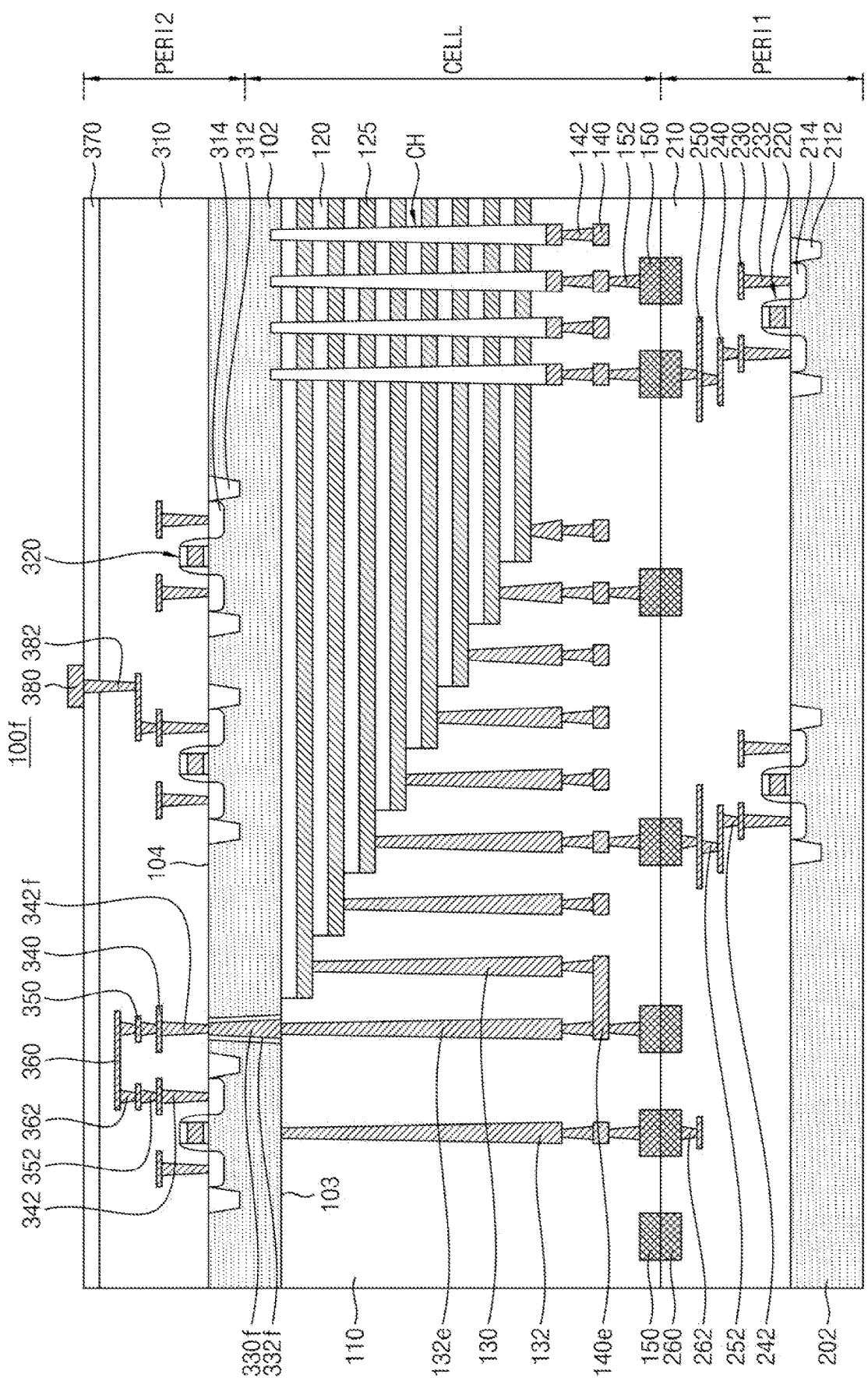

Referring to FIG. 26, a semiconductor device 100f may include a through electrode 330f extending vertically through a second substrate 202 and electrically connecting a first peripheral circuit area PERI1 and a second peripheral circuit area PERI2 to each other, and a through electrode insulating layer 332f surrounding a side surface of the through electrode 330f. The through electrode 330f may have a tapered shape such that the lateral width of the through electrode 330f is gradually reduced as the through electrode 330f extends from a first surface 103 to a second surface 104. An upper surface of the through electrode 330f may contact a through electrode plug 342f connected to a first wiring layer 340. A lower surface of the through electrode 330f may contact a through contact plug 132e. The upper surface of the through electrode 330f may be substantially coplanar with the second surface 104, and the lower surface of the through electrode 330f may be substantially coplanar with the first surface 103.

Figure 27:
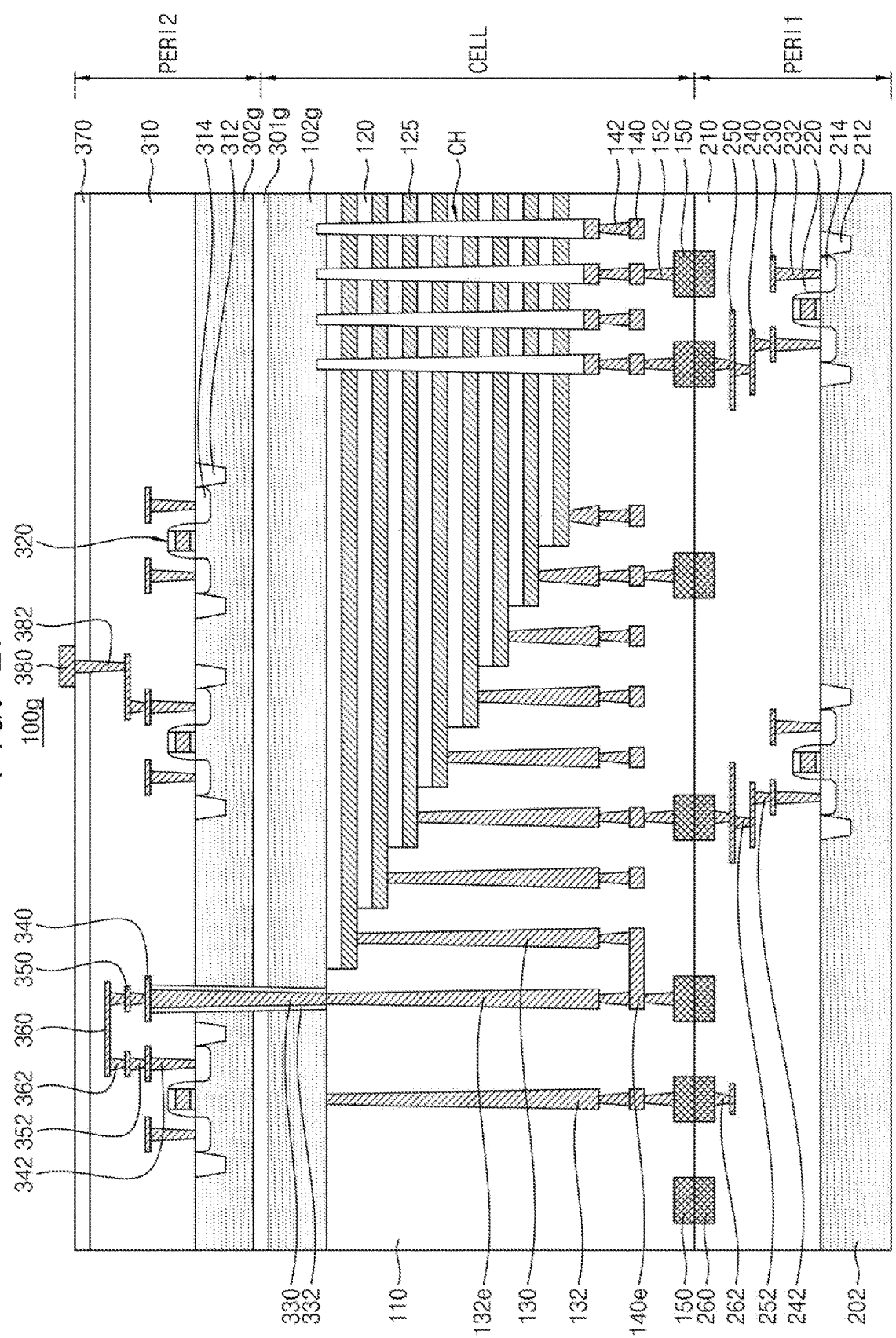

Referring to FIG. 27, a semiconductor device 100g may include a first lower substrate 102g, a buried insulating layer 301g, and a first upper substrate 320g. In an implementation, the first lower substrate 102g may include a semiconductor material such as monocrystalline silicon. The buried insulating layer 301g may include silicon oxide, silicon nitride, silicon oxynitride, or a combination thereof. The first upper substrate 302g may include polysilicon.

Figure 28:
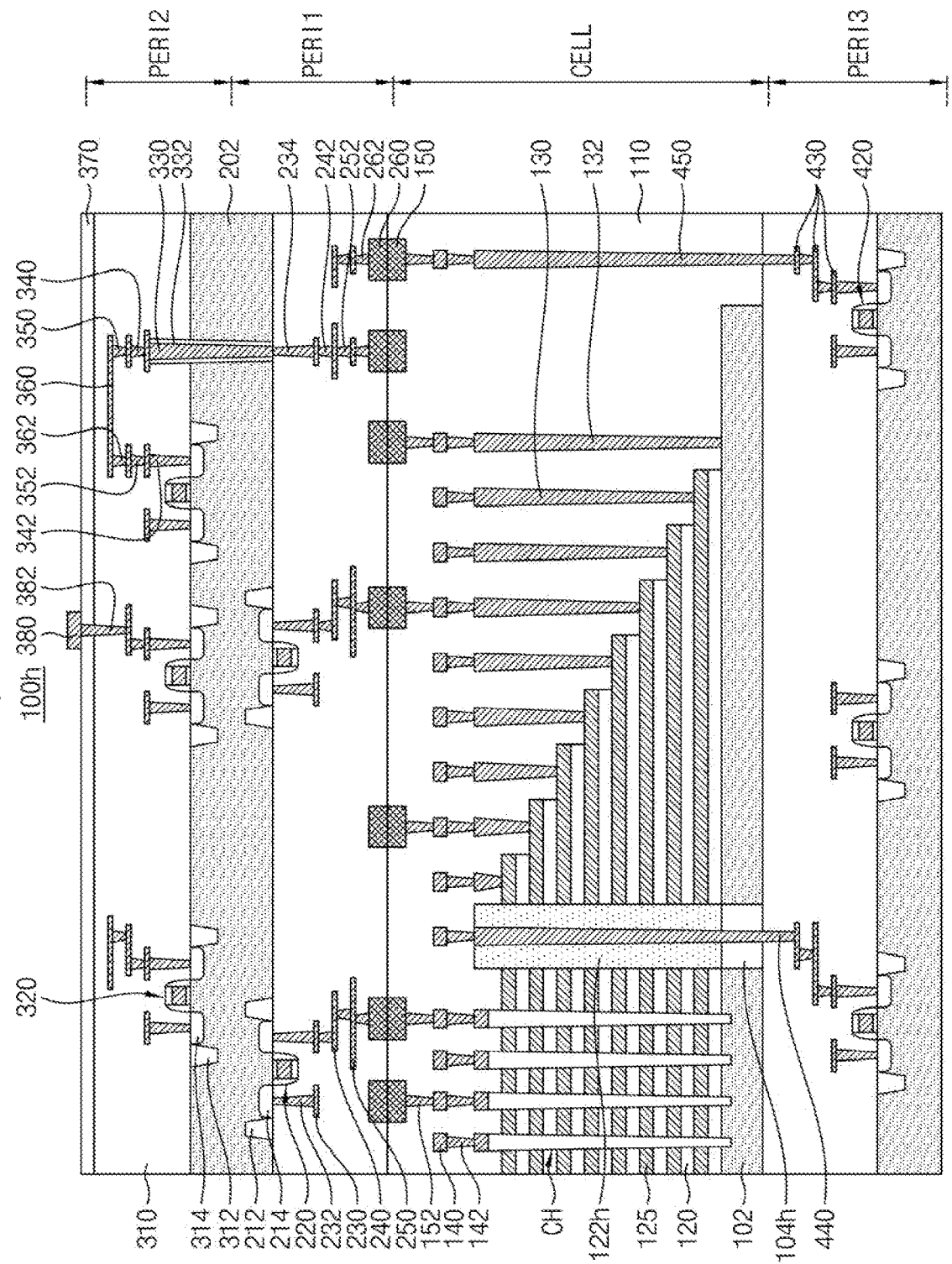

Referring to FIG. 28, a semiconductor device 100h may include a cell area CELL, a first peripheral circuit area PERI1 on the cell area CELL, and a second peripheral circuit area PERI2 on the first peripheral circuit area PERI1 and a third peripheral circuit area PERI3 under the cell area CELL. The first peripheral circuit area PERI1 and the second peripheral circuit area PERI2 may include configurations similar to those of the semiconductor device 100 of FIG. 4.

In an implementation, the cell area CELL and the third peripheral circuit area PERI3 may have a cell-on-peri (COP) structure. The third peripheral circuit area PERI3 may include a third substrate 402, a device 420 on the third substrate 402, and wiring layers 430 connected to the device 420. The cell area CELL may include a first through contact plug 440 and a second through contact plug 450 which are connected to the wiring layers 430.

The first through contact plug 440 may extend vertically through the first substrate 102 such that the first through contact plug 440 contacts a contact plug 142. The first through contact plug 440 may be electrically insulated from the first substrate 102 by a buried insulating layer 104h in the first substrate 102. The first through contact plug 440 may also be electrically insulated from gate electrodes 125 by a contact insulating layer 122h. In an implementation, the contact insulating layer 122h may extend vertically through the gate electrodes 125, and the first through contact plug 440 may extend vertically through the first substrate 102 and the contact insulating layer 122h such that the first through contact plug 440 is electrically connected to the third peripheral circuit area PERI3.

The second through contact plug 450 may extend vertically from a corresponding one of the wiring layers 430 through a cell area insulating layer 110 such that the second through contact plug 450 contacts another contact plug 142. The second through contact plug 450 may electrically connect the third peripheral circuit area PERI3 to the first peripheral circuit area PERI1 through a first bonding pad 150 and a second bonding pad 260.

Figure 29:
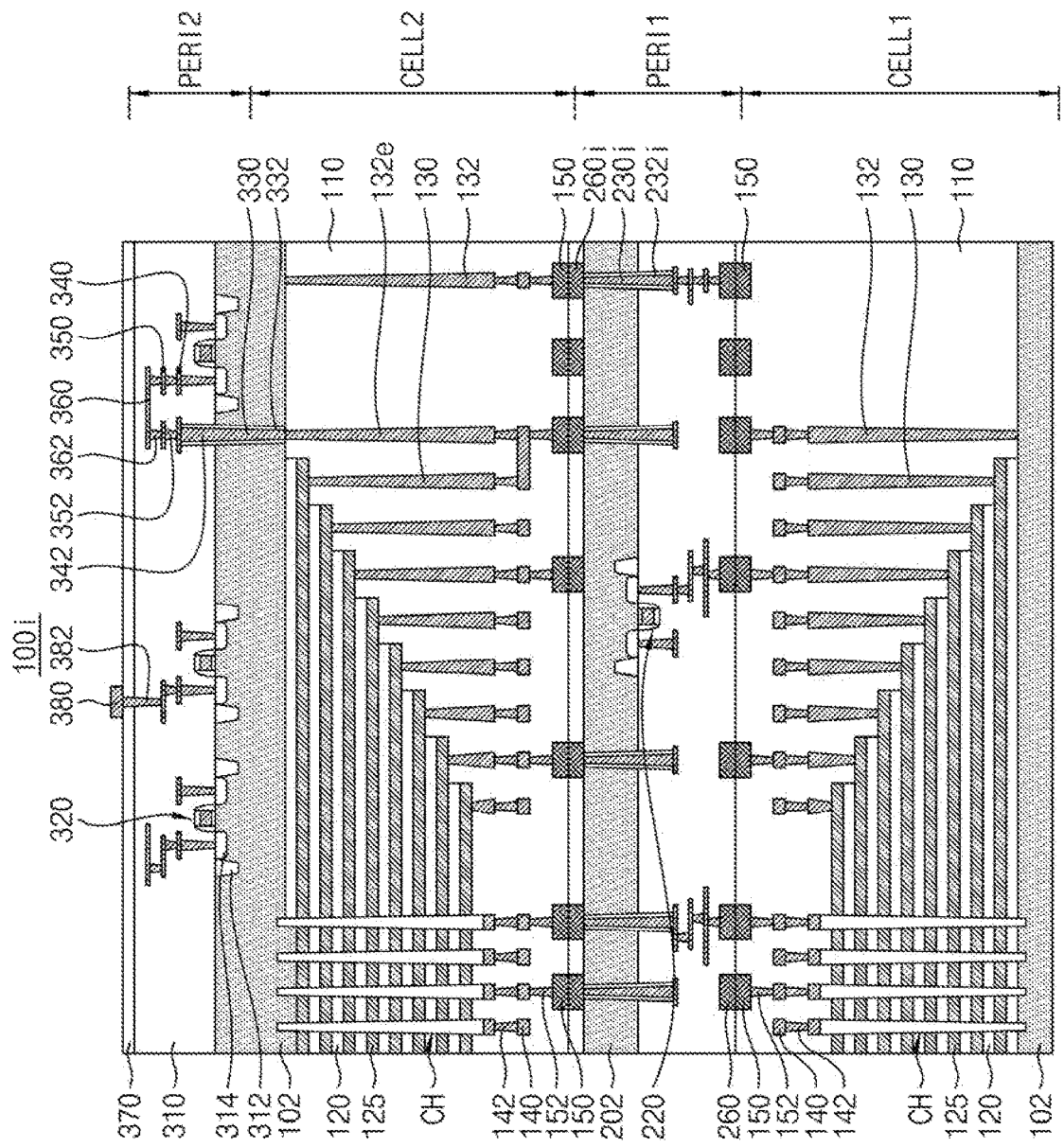

Referring to FIG. 29, a semiconductor device 100i may include a first cell area CELL1, a first peripheral circuit area PERI1 on the first cell area CELL1, a second cell area CELL2 on the first peripheral circuit area PERI1 and a second peripheral circuit area PERI2 on the second cell area CELL2.

The first cell area CELL1 and the first peripheral circuit area PERI1 may include configurations identical or similar to the cell area CELL and the first peripheral circuit area PERI1 in FIG. 4, respectively. In an implementation, wiring structures of the first cell area CELL1 and the first peripheral circuit area PERI1 in FIG. 29 may be partially different from those of the cell area CELL and the first peripheral circuit area PERI1 in FIG. 4. In an implementation, the first peripheral circuit area PERI1 may include a through electrode 230i extending through a second substrate 202, a through electrode insulating layer 232i surrounding a side surface of the through electrode 230i, and a third bonding pad 260i. An upper surface of the through electrode 230i may contact the third bonding pad 260i. The through electrode 230i may have a tapered shape such that the lateral width of the through electrode 230i is gradually reduced as the through electrode 230i extends toward the third bonding pad 260i.

The second cell area CELL2 and the second peripheral circuit area PERI2 may include configurations identical or similar to those of the cell area CELL and the second peripheral circuit area PERI2 in FIG. 25, respectively. In an implementation, wiring structures of the second cell area CELL2 and the second peripheral circuit area PERI2 may be partially different from those of the cell area CELL and the second peripheral circuit area PERI2 in FIG. 25. The second cell area CELL2 may include a fourth bonding pad 150 bonded to the third bonding pad 260i.

One or more embodiments may provide a semiconductor device having peripheral circuit areas on both surfaces of a substrate.

In accordance with the exemplary embodiments of the disclosure, peripheral circuit areas may be at opposite surfaces of a substrate and, as such, a wider variety of wiring interconnections may be embodied in a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a cell area including a first substrate, gate electrodes on the first substrate and spaced apart from one another in a vertical direction, a channel structure extending vertically through the gate electrodes, cell contact plugs connected to the gate electrodes and extending in the vertical direction, a through contact plug connected to the first substrate and extending in the vertical direction, and first bonding pads electrically connected to the channel structure, the cell contact plugs and the through contact plug;
a first peripheral circuit area connected to the cell area on the cell area, the first peripheral circuit area including second bonding pads on the first bonding pads;
a second peripheral circuit area connected to the first peripheral circuit area and comprising a logic circuit configured to control operations of the semiconductor device; and
a second substrate including a lower surface in the first peripheral circuit area and an upper surface in the second peripheral circuit area and opposite to the lower surface of the second substrate,
wherein the first peripheral circuit area includes:
a first device isolation layer extending from the lower surface of the second substrate toward the upper surface of the second substrate; and
a first impurity region formed in the lower surface of the second substrate and adjacent the first device isolation layer, and
wherein the second peripheral circuit area includes:
a device directly disposed on the upper surface of the second substrate,
a through electrode extending vertically through the second substrate and connected to the first peripheral circuit area,
a second device isolation layer extending from the upper surface of the second substrate toward the lower surface of the second substrate, and
a second impurity region formed in the upper surface of the second substrate and adjacent the second device isolation layer.
2. The semiconductor device as claimed in claim 1, wherein the through electrode is electrically connected to the cell area through at least one of the second bonding pads and at least one of the first bonding pads.

3. The semiconductor device as claimed in claim 1, wherein:
the first peripheral circuit area includes:
a wiring layer electrically connected to one of the second bonding pads, and
a first through electrode plug connected to the wiring layer, and a lower surface of the through electrode contacts the first through electrode plug.

4. The semiconductor device as claimed in claim 1, wherein:
the second peripheral circuit area further includes an input/output pad on an upper surface thereof, and
the input/output pad is electrically connected to the device in the second peripheral circuit area.

5. The semiconductor device as claimed in claim 1, wherein a lower surface of the through electrode is substantially coplanar with the lower surface of the second substrate.

6. The semiconductor device as claimed in claim 1, further comprising a through electrode insulating layer surrounding a side surface of the through electrode.

7. The semiconductor device as claimed in claim 1, wherein the through electrode has a tapered shape such that a width of the through electrode is gradually reduced as the through electrode extends from the upper surface of the second substrate to the lower surface of the second substrate.

8. The semiconductor device as claimed in claim 1, wherein the through electrode has a tapered shape such that a width of the through electrode is gradually reduced as the through electrode extends from the lower surface of the second substrate to the upper surface of the second substrate.

9. The semiconductor device as claimed in claim 8, wherein:
the second peripheral circuit area includes:
a wiring layer electrically connected to the device, and
a second through electrode plug connected to the wiring layer, and an upper surface of the through electrode contacts the second through electrode plug.

10. The semiconductor device as claimed in claim 8, wherein an upper surface of the through electrode is substantially coplanar with the upper surface of the second substrate.

11. The semiconductor device as claimed in claim 1, wherein:
the first peripheral circuit area includes a wiring layer electrically connected to one of the second bonding pads, and
a lower surface of the through electrode is at a lower level than the lower surface of the second substrate and contacting the wiring layer.

12. The semiconductor device as claimed in claim 1, wherein:
the first peripheral circuit area further includes an input/output pad at a lower surface thereof, and
the input/output pad is electrically connected to one of the first bonding pads.

13. The semiconductor device as claimed in claim 1, wherein the second substrate includes:
a second lower substrate,
a second upper substrate on the second lower substrate, and
a buried insulating layer between the second lower substrate and the second upper substrate.

14. The semiconductor device as claimed in claim 1, further comprising a third peripheral circuit area under the cell area and connected to the cell area,
wherein the cell area includes:
a contact insulating layer extending vertically through the gate electrodes, and
a through contact plug extending vertically through the first substrate and the contact insulating layer such that the through contact plug is connected to the third peripheral circuit area.

15. A semiconductor device, comprising:
a cell area including a first substrate, gate electrodes on a lower surface of the first substrate and spaced apart from one another in a vertical direction, a channel structure extending vertically through the gate electrodes, cell contact plugs connected to the gate electrodes and extending in the vertical direction, a through contact plug connected to the first substrate and extending in the vertical direction, and first bonding pads electrically connected to the channel structure, the cell contact plugs, and the through contact plug;
a first peripheral circuit area under the cell area and connected to the cell area, the first peripheral circuit area including second bonding pads on the first bonding pads; and
a second peripheral circuit area connected to the cell area on the cell area and comprising a logic circuit configured to control operations of the semiconductor device,
wherein the lower surface of the first substrate is in the cell area, and an upper surface of the first substrate is in the second peripheral circuit area and opposite to the lower surface of the first substrate, and
wherein the second peripheral circuit area includes:
an active device directly disposed on the upper surface of the first substrate,
a device isolation layer extending from the upper surface of the first substrate toward the lower surface of the first substrate,
an impurity region formed in the upper surface of the first substrate and adjacent the device isolation layer, and
a through electrode extending vertically through the first substrate such that the through electrode is electrically connected to the cell area,
wherein a horizontal width of an upper surface of the device isolation layer is greater than a horizontal width of a lower surface of the device isolation layer.

16. The semiconductor device as claimed in claim 15, wherein the through electrode is electrically connected to the first peripheral circuit area through the through contact plug and one of the first bonding pads.

17. The semiconductor device as claimed in claim 15, wherein the through electrode has a tapered shape such that a width of the through electrode is gradually reduced as the through electrode extends from the lower surface of the first substrate to the upper surface of the first substrate.

18. The semiconductor device as claimed in claim 15, wherein the first substrate includes a first lower substrate, a first upper substrate on the first lower substrate, and a buried insulating layer between the first lower substrate and the first upper substrate.

19. A semiconductor device, comprising:
a cell area including a first substrate, gate electrodes on the first substrate and spaced apart from one another in a vertical direction, a channel structure extending vertically through the gate electrodes, cell contact plugs connected to the gate electrodes and extending in the vertical direction, a through contact plug connected to the first substrate and extending in the vertical direction, and first bonding pads electrically connected to the channel structure, the cell contact plugs, and the through contact plug;

a first peripheral circuit area on the cell area and connected to the cell area, the first peripheral circuit area including second bonding pads on the first bonding pads, respectively;

a second peripheral circuit area on the first peripheral circuit area and connected to the first peripheral circuit area and comprising a logic circuit configured to control operations of the semiconductor device;

a semiconductor storage device including a second substrate including a lower surface in the first peripheral circuit area and an upper surface in the second peripheral circuit area, and an input/output pad electrically connected to at least one of the first peripheral circuit area or the second peripheral circuit area; and a controller electrically connected to the semiconductor storage device through the input/output pad such that the controller controls the semiconductor storage device, wherein the first peripheral circuit area includes:

a first device isolation layer extending from the lower surface of the second substrate toward the upper surface of the second substrate; and a first impurity region formed in the lower surface of the second substrate and adjacent the first device isolation layer, and wherein the second peripheral circuit area includes:

a device directly on the upper surface of the second substrate, a through electrode extending vertically through the second substrate such that the through electrode is electrically connected to the first peripheral circuit area, a second device isolation layer extending from the upper surface of the second substrate toward the lower surface of the second substrate, and a second impurity region formed in the upper surface of the second substrate and adjacent the second device isolation layer.

20. The semiconductor device as claimed in claim 19, wherein the through electrode is electrically connected to the cell area through at least one of the second bonding pads and at least one of the first bonding pads.

* * * * *